US012725554B2

(12) United States Patent
Um

(10) Patent No.: US 12,725,554 B2

(45) Date of Patent: Sep. 1, 2026

(54) DISPLAY DEVICE HAVING DIFFERENT EMISSION MODES ACCORDING TO GRAYSCALE

(71) Applicant: Samsung Display Co., LTD., Yongin-si (KR)

(72) Inventor: Jae Gwang Um, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/776,854

(22) Filed: Jul. 18, 2024

(65) Prior Publication Data

US 2025/0209955 A1 Jun. 26, 2025

(30) Foreign Application Priority Data

Dec. 26, 2023 (KR) ........................ 10-2023-0191532

(51) Int. Cl.

*G09G 3/20* (2006.01)
*G09G 3/32* (2016.01)
*G09G 3/3233* (2016.01)
*H01L 25/16* (2023.01)
*H10K 59/35* (2023.01)
*H10K 59/90* (2026.01)
*H10W 90/00* (2026.01)

(52) U.S. Cl.

CPC ............. *G09G 3/2074* (2013.01); *G09G 3/32* (2013.01); *G09G 3/3233* (2013.01); *H10K 59/90* (2023.02); *H10W 90/00* (2026.01); *G09G 2300/0452* (2013.01); *G09G 2300/0809* (2013.01); *H10K 59/353* (2023.02)

(58) Field of Classification Search

CPC ...... G09G 3/2074; G09G 3/32; G09G 3/3233; G09G 2300/0452; G09G 2300/0809; H10K 59/90; H10K 59/353; H01L 25/167

See application file for complete search history.

(56) References Cited

U.S. PATENT DOCUMENTS 10,139,643 B2 11/2018 Ryu
2003/0160746 A1 8/2003 Yamazaki et al.
2006/0221092 A1* 10/2006 Noguchi ................ H05B 33/02 345/589
2008/0042946 A1* 2/2008 Park ..................... G09G 3/3275 345/82

(Continued)

FOREIGN PATENT DOCUMENTS

JP 11-212060 8/1999
JP 2003-323157 11/2003

(Continued)

OTHER PUBLICATIONS

International Search Report dated Feb. 15, 2025, in International Application No. PCT/KR2024/017815.

*Primary Examiner* — Kwang-Su Yang

(74) *Attorney, Agent, or Firm* — CANTOR COLBURN LLP

(57) ABSTRACT

A display device includes a display panel including a pixel, a data driver providing a data voltage to the pixel, a gate driver providing a gate signal to the pixel, and a controller controlling the data driver and the gate driver. The pixel includes a first sub-pixel including a first light emitting element, and a second sub-pixel including multiple second light emitting elements.

16 Claims, 22 Drawing Sheets

(56) References Cited

U.S. PATENT DOCUMENTS

| | | | | |
|---|---|---|---|---|
| 2009/0051283 | A1* | 2/2009 | Cok | H10K 59/877<br>313/506 |
| 2014/0145586 | A1* | 5/2014 | Choi | H10K 59/351<br>313/504 |
| 2015/0371605 | A1* | 12/2015 | Wu | G09G 5/02<br>345/604 |
| 2017/0153366 | A1* | 6/2017 | Park | G02B 5/208 |
| 2018/0269266 | A1* | 9/2018 | Cancel Olmo | H10K 59/353 |
| 2019/0066582 | A1* | 2/2019 | Kim | H10K 59/131 |
| 2020/0013766 | A1* | 1/2020 | Kim | H01L 25/167 |
| 2020/0168668 | A1* | 5/2020 | Kim | H10K 50/856 |
| 2021/0035493 | A1* | 2/2021 | Hashimoto | G09G 3/2081 |
| 2021/0408137 | A1* | 12/2021 | Lee | H10K 59/353 |
| 2022/0285586 | A1* | 9/2022 | Yang | H10H 20/01 |
| 2022/0415977 | A1* | 12/2022 | Lee | H10K 59/35 |

FOREIGN PATENT DOCUMENTS

| | | |
|---|---|---|
| JP | 3952618 | 8/2007 |
| JP | 2023-524635 | 6/2023 |
| KR | 10-2015-0060134 | 6/2015 |
| KR | 10-2017-0047324 | 5/2017 |
| KR | 10-2207846 | 1/2021 |
| KR | 10-2021-0099973 | 8/2021 |
| KR | 10-2562841 | 8/2023 |
| WO | 2016/030422 | 3/2016 |
| WO | 2018/089189 | 5/2018 |
| WO | 2021/158004 | 8/2021 |
| WO | 2021/216645 | 10/2021 |

* cited by examiner

FIG. 9

DISPLAY DEVICE HAVING DIFFERENT EMISSION MODES ACCORDING TO GRAYSCALE

CROSS-REFERENCE TO RELATED APPLICATIONS

The present application claims priority under 35 U.S.C. § 119 from Korean patent Application No. 10-2023-0191532 filed on Dec. 26, 2023 in the Korean Intellectual Property Office, the entire contents of which are incorporated herein by reference.

BACKGROUND

1. Technical Field

The disclosure generally relates to a display device.

2. Description of the Related Art

With the development of information technologies, the importance of a display device which may be a connection medium between a user and information increases. Accordingly, display devices such as a liquid crystal display device, an organic light emitting display device, and an inorganic light emitting display device are increasingly used.

SUMMARY

Embodiments provide a display device displaying an image with a high luminance.

In accordance with an aspect of the disclosure, there may be provided a display device that may include a display panel including a pixel; a data driver configured to provide a data voltage to the pixel; a gate driver configured to provide a gate signal to the pixel; and a controller configured to control the data driver and the gate driver, wherein the pixel may include a first sub-pixel including a first light emitting element; and a second sub-pixel including a plurality of second light emitting elements.

Each of the plurality of second light emitting elements may be smaller than the first light emitting element.

The plurality of second light emitting elements may be electrically connected in parallel.

Each of the plurality of second light emitting elements may display a same color as the first light emitting element.

Ones of the plurality of second light emitting elements may display different colors.

The first sub-pixel may include a (1-1)th sub-pixel displaying a first color; a (1-2) th sub-pixel displaying a second color; and a (1-3)th sub-pixel displaying a third color. The plurality of second light emitting elements may include a (2-1)th light emitting element displaying the first color; a (2-2)th light emitting element displaying the second color; and a (2-3)th light emitting element displaying the third color.

The first light emitting element may be on in a first mode, and the plurality of second light emitting elements may be off in the first mode.

The first light emitting element may be on in a second mode, and the plurality of second light emitting elements may be on in the second mode.

A peak luminance in the second mode may be higher than a peak luminance in the first mode.

The display panel may be driven in one of a (1-1)th mode, a (1-2)th mode, and a second mode. An emission time of the first light emitting element may be controlled according to a grayscale in the (1-1)th mode. A magnitude of a driving current applied to the first light emitting element may be controlled according to the grayscale in the (1-2)th mode. The emission time of the first light emitting element and the magnitude of the driving current applied to the first light emitting element may be controlled according to the grayscale in the second mode. An emission time of the plurality of second light emitting elements and a magnitude of a driving current applied to the second light emitting elements may be controlled according to the grayscale in the second mode.

The display panel may include sub-pixels that may include the first sub-pixel and the second sub-pixel. Each of the sub-pixels may include a first sub-pixel circuit configured to control an emission time of a light emitting element of each of the sub-pixels according to the grayscale; and a second sub-pixel circuit configured to control a magnitude of a driving current applied to the light emitting element according to the grayscale.

The first light emitting element may be controlled by the first sub-pixel circuit in the (1-1)th mode, may be controlled by the second sub-pixel circuit in the (1-2)th mode, and may be controlled by the first sub-pixel circuit and the second sub-pixel circuit in the second mode. The plurality of second light emitting elements may be controlled by the first sub-pixel circuit and the second sub-pixel circuit in the second mode.

The second sub-pixel may display a white color.

The first sub-pixel may include a (1-1)th sub-pixel displaying a first color; a (1-2) th sub-pixel displaying a second color; and a (1-3)th sub-pixel displaying a third color. The (1-1)th sub-pixel may include a first light conversion pattern, the (1-2)th sub-pixel may include a second light conversion pattern, and the (1-3)th sub-pixel may include a third light conversion pattern. The second sub-pixel may include the first to third light conversion patterns.

The first to third light conversion patterns in the second sub-pixel may overlap each other.

The first sub-pixel may include a (1-1)th sub-pixel displaying a first color; a (1-2) th sub-pixel displaying a second color; and a (1-3)th sub-pixel displaying a third color. The (1-1)th sub-pixel may include a first color filter, the (1-2)th sub-pixel may include a second color filter, and the (1-3)th sub-pixel may include a third color filter. The second sub-pixel may not include the first to third color filters.

In accordance with another aspect of the disclosure, there may be provided a display device that may include a display panel including a pixel; a data driver configured to provide a data voltage to the pixel; a gate driver configured to provide a gate signal to the pixel; and a controller configured to control the data driver and the gate driver, wherein the pixel may include a (1-1)th sub-pixel including a plurality of (1-1)th light emitting elements; a (1-2)th sub-pixel including a plurality of (1-2)th light emitting elements; a (1-3)th sub-pixel including a plurality of (1-3)th light emitting elements; and a second sub-pixel including a second light emitting element.

The plurality of (1-1)th light emitting elements may display a first color, the plurality of (1-2)th light emitting elements may display a second color, and the plurality of (1-3)th light emitting elements may display a third color. The second light emitting element may display any one of the first to third colors.

In accordance with still another aspect of the disclosure, there may be provided a display device that may include a display panel including a pixel; a data driver configured to provide a data voltage to the pixel; a gate driver configured to provide a gate signal to the pixel; and a controller configured to control the data driver and the gate driver, wherein the pixel may include a first sub-pixel including a first light emitting element including an inorganic light emitting diode; and a second sub-pixel including a second light emitting element including an organic light emitting diode.

The second light emitting element may display a white color.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments may be provided so that this disclosure will be thorough and complete, and will fully convey the scope of the example embodiments to those skilled in the art.

In the drawing figures, dimensions may be exaggerated for clarity of illustration. It will be understood that when an element may be referred to as being "between" two elements, it can be the only element between the two elements, or one or more intervening elements may also be present. Like reference numerals refer to like elements throughout.

FIG. 9 is a schematic sectional view taken along line II-II' shown in FIG. 7.

DETAILED DESCRIPTION OF THE EMBODIMENTS

Figure 1:
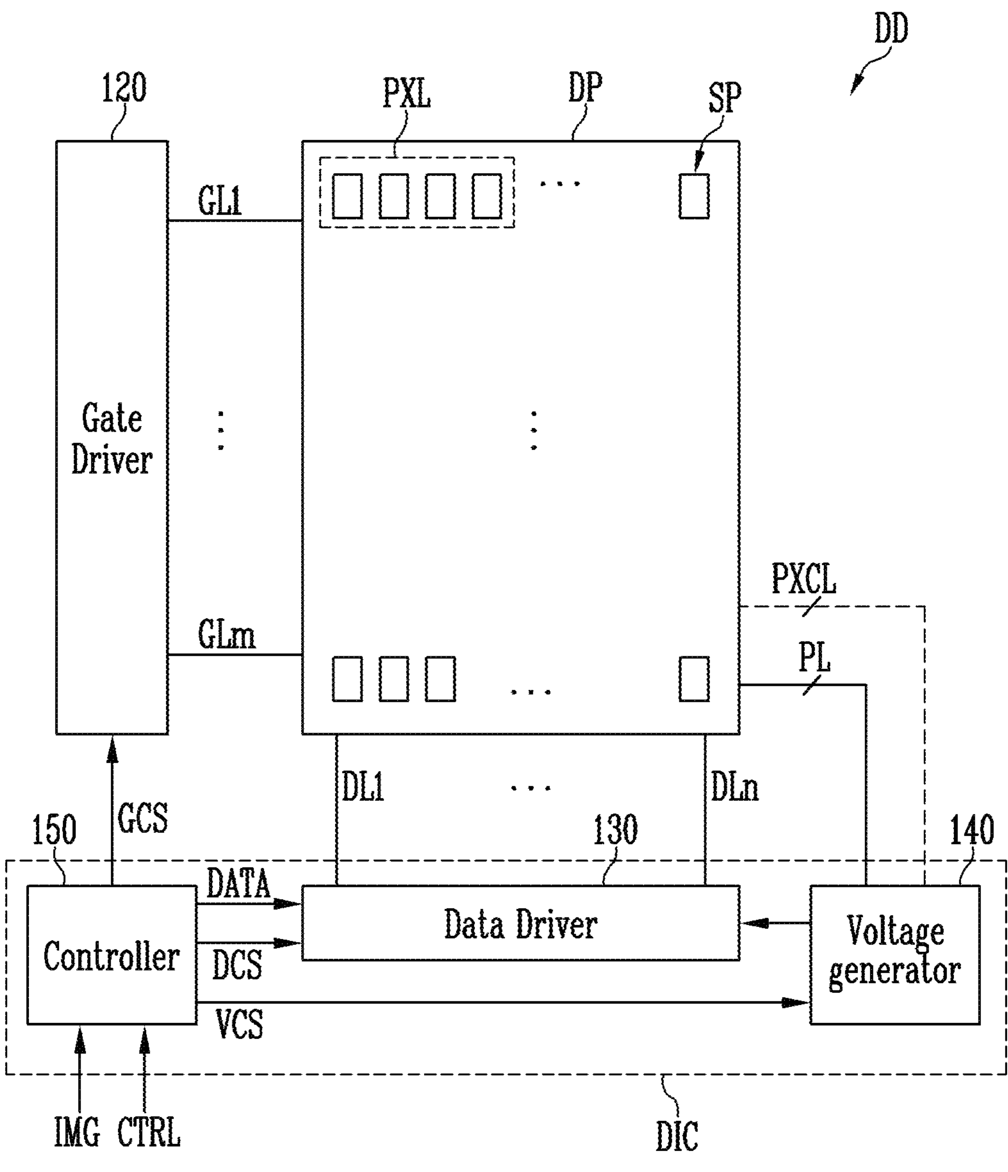
FIG. 1 is a schematic block diagram illustrating an embodiment of a display device.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic block diagram illustrating an embodiment of a display device.

Referring to FIG. 1, the display device DD may include a display panel DP, a gate driver 120, a data driver 130, a voltage generator 140, and a controller 150.

The display panel DP may include sub-pixels SP. The sub-pixels SP may be electrically connected to the gate driver 120 through first to mth gate lines GL1 to GLm. The sub-pixels SP may be electrically connected to the data driver 130 through first to nth data lines DL1 to DLn.

The sub-pixels SP may generate light of two or more colors. For example, each of the sub-pixels SP may generate light of red, green, blue, cyan, magenta, yellow, white, and the like.

Two or more sub-pixels among the sub-pixels SP may constitute a pixel PXL. For example, the pixel PXL may include four sub-pixels as shown in FIG. 1. As such, the pixel PXL may emit lights of various colors with various luminosity according to a combination of light emitted from the sub-pixels included therein.

The gate driver 120 may be electrically connected to the sub-pixels SP arranged in a row direction through the first to mth gate lines GL1 to GLm. The gate driver 120 may output gate signals to the first to mth gate lines GL1 to GLm in response to a gate control signal GCS. In embodiments, the gate control signal GCS may include a start signal indicating a start of each frame, a horizontal synchronization signal, and the like.

The gate driver 120 may be disposed at a side of the display panel DP. However, embodiments are not limited thereto. For example, the gate driver 120 may be divided into two or more drivers which may be physically and/or logically divided, and these drivers may be disposed at a side of the display panel DP and another side of the display panel DP, which may be opposite to the side. As such, in some embodiments, the gate driver 120 may be disposed in various forms at the periphery of the display panel DP.

The data driver 130 may be electrically connected to the sub-pixels SP arranged in a column direction through the first to nth data lines DL1 to DLn. The data driver 130 may receive image data DATA and a data control signal DCS from the controller 150. The data driver 130 may operate in response to the data control signal DCS. In embodiments, the data control signal DCS may include a source start pulse, a source shift clock, a source output enable signal, and the like.

The data driver 130 may receive voltages from the voltage generator 140. The data driver 130 may apply data signals having grayscale voltages corresponding to the image data DATA to the first to nth data lines DL1 to DLn by using the received voltages. In case that a gate signal is applied to each of the first to mth gate lines GL1 to GLm, data signals corresponding to the image data DATA may be applied to the first to nth data line DL1 to DLm. Accordingly, corresponding sub-pixels SP may generate light corresponding to the data signals. Accordingly, an image may be displayed on the display panel DP.

In embodiments, the gate driver 120 and the data driver 130 may include complementary metal-oxide semiconductor (CMOS) circuit elements.

The voltage generator 140 may operate in response to a voltage control signal VCS from the controller 150. The voltage generator 140 may be configured to generate multiple voltages and provide the generated voltages to components of the display device DD. The voltage generator 140 may generate multiple voltages by receiving an input voltage from the outside of the display device DD and may regulate the received voltage.

The voltage generator 140 may generate a first power voltage and a second power voltage. The generated first and second power voltages may be provided to the sub-pixels SP through power lines PL. In other embodiments, at least one of the first and second power voltages may be provided from an outside of the display device DD.

Besides, the voltage generator 140 may provide various voltages and/or signals. For example, the voltage generator 140 may provide one or more initialization voltages applied to the sub-pixels SP. For example, in a sensing operation for sensing electrical characteristics of transistors and/or light emitting elements of the sub-pixels SP, a reference voltage (e.g., a predetermined or selectable reference voltage) may be applied to the first to nth data lines DL1 to DLn, and the voltage generator 140 may generate the reference voltage and transfer the reference voltage to the data driver 130. For example, in a display operation for displaying an image on the display panel DP, common pixel control signals may be applied to the sub-pixels SP, and the voltage generator 140 may generate the pixel control signals. In embodiments, the voltage generator 140 may provide the pixel control signals to the sub-pixels SP through pixel control lines PXCL. In FIG. 1, it is illustrated that the pixel control lines PXCL may be electrically connected between the voltage generator 140 and the display panel DP. However, embodiments are not limited thereto. For example, the pixel control lines PXCL may be electrically connected between the gate driver 120 and the display panel DP. The pixel control signals may be transferred to the sub-pixels SP from the gate driver 120 through the pixel control lines PXCL.

The controller 150 may control overall operations of the display device DD. The controller 150 may receive from the outside input image data IMG and a control signal CTRL corresponding thereto. The controller 150 may provide the gate control signal GCS, the data control signal DCS, and the voltage control signal VCS in response to the control signal CTRL.

The controller 150 may convert the input image data IMG to be suitable for the display device DD or the display panel DP, thereby outputting the image data DATA. In embodiments, the controller 150 may align the input image data IMG to be suitable for the sub-pixels SP in units of rows, thereby outputting the image data DATA.

Two or more components among the data driver 130, the voltage generator 140, and the controller 150 may be mounted on an integrated circuit. As shown in FIG. 1, the data driver 130, the voltage generator 140, and the controller 150 may be included in a driver integrated circuit DIC. The data driver 130, the voltage generator 140, and the controller 150 may be components functionally divided in a driver integrated circuit DIC. In other embodiments, at least one of the data driver 130, the voltage generator 140, and the controller 150 may be provided as a component distinguished from the driver integrated circuit DIC.

Figure 2:
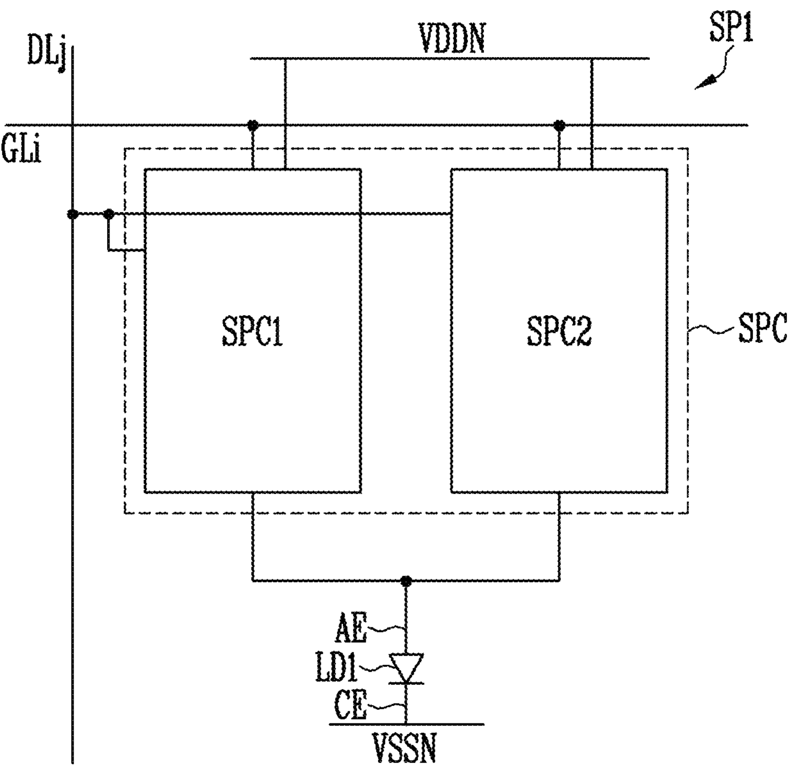
FIG. 2 is a schematic block diagram illustrating an embodiment of a first sub-pixel among sub-pixels shown in FIG. 1.
Figure 3:
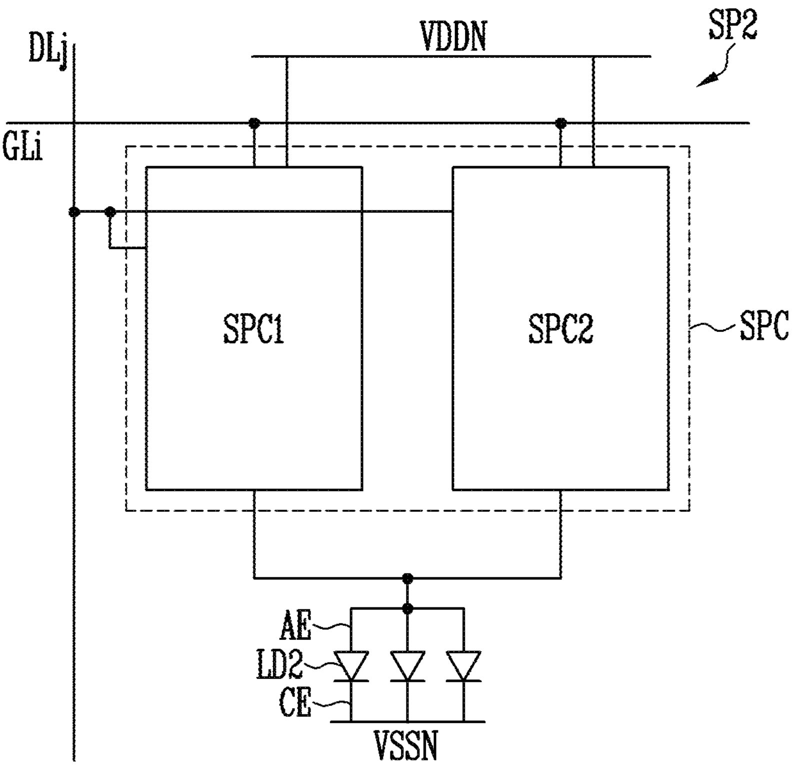
FIG. 3 is a schematic block diagram illustrating an embodiment of a second sub-pixel among the sub-pixels shown in FIG. 1.

FIG. 2 is a schematic block diagram illustrating an embodiment of a first sub-pixel among the sub-pixels shown in FIG. 1. FIG. 3 is a schematic block diagram illustrating an embodiment of a second sub-pixel among the sub-pixels shown in FIG. 1. In FIGS. 2 and 3, a sub-pixel arranged on an ith row (i is an integer which is greater than or equal to 1 and is smaller than or equal to m) and a jth column (j is an integer which is greater than or equal to 1 and is smaller than or equal to n) among the sub-pixels SP shown in FIG. 1 is exemplarily illustrated.

Referring to FIGS. 2 and 3, each of the first and second sub-pixels SP1 or SP2 may include a sub-pixel circuit SPC and a light emitting element LD1 or LD2. The sub-pixel circuit SPC may include a first sub-pixel circuit SPC1 which controls an emission time of the light emitting element LD1 or LD2 according to a grayscale and a second sub-pixel circuit SPC2 which controls a magnitude of a driving current applied to the light emitting element LD1 or LD2 according to a grayscale.

The light emitting element LD1 or LD2 may be electrically connected between a first power voltage node VDDN and a second power voltage node VSSN. The first power voltage node VDDN may be electrically connected to one of the power lines PL shown in FIG. 1 to receive a first power voltage. The second power voltage node VSSN may be electrically connected to another of the power lines PL to receive a second power voltage. The first power voltage may have a voltage level higher than a voltage level of the second power voltage.

In this embodiment, it may be exemplified that the first sub-pixel circuit SPC1 and the second sub-pixel circuit SPC2 are electrically connected to the same first power voltage node VDDN. However, the disclosure is not limited thereto. For example, the first sub-pixel circuit SPC1 and the second sub-pixel circuit SPC2 may be electrically connected to different power voltage nodes, and first power voltages having different magnitudes may be applied to the first sub-pixel circuit SPC1 and the second sub-pixel circuit SPC2.

The light emitting element LD1 or LD2 may be electrically connected between an anode electrode AE and a cathode electrode CE. The anode electrode AE may be electrically connected to the first power voltage node VDDN through the sub-pixel circuit SPC1 or SPC2. For example, the anode electrode AE may be electrically connected to the first power voltage node VDDN through one or more transistors included in the sub-pixel circuit SPC1 or SPC2. The cathode electrode CE may be electrically connected to the second power voltage node VSSN. The light emitting element LD1 or LD2 may be configured to emit light according to a current flowing from the anode electrode AE to the cathode electrode CE.

The first sub-pixel SP1 may include a first light emitting element LD1. For example, the first sub-pixel SP1 may include a first light emitting element LD1.

The second sub-pixel SP2 may include multiple second light emitting elements LD2. For example, the second sub-pixel SP2 may include multiple second light emitting elements electrically connected in parallel. The second sub-pixel SP2 may include multiple second light emitting elements LD2 electrically connected in parallel so that a high luminance can be implemented.

The light emitting element LD1 or LD2 will be described in detail later.

The sub-pixel circuit SPC may be electrically connected to an ith gate line GLi among the first to mth gate lines GL1 to GLm shown in FIG. 1 and a jth data line DLj among the first to nth data lines DL1 to DLn shown in FIG. 1. In response to a gate signal received through the ith gate line GLi, the sub-pixel circuit SPC controls the light emitting element LD1 or LD2 to emit light according to a data signal received through the jth data line DLj. In embodiments, the sub-pixel circuit SPC1 or SPC2 may further be electrically connected to the pixel control lines PXCL shown in FIG. 1. The sub-pixel circuit SPC may further control the light emitting element LD1 or LD2 in response to control signals received through the pixel control lines PXCL.

For these operations, the sub-pixel circuit SPC may include circuit elements, e.g., transistors and one or more capacitors.

In this embodiment, it is exemplified that the first sub-pixel circuit SPC1 and the second sub-pixel circuit SPC2 may be electrically connected to a same gate line (e.g., GLi). However, the disclosure is not limited thereto. For example, the first sub-pixel circuit SPC1 and the second sub-pixel circuit SPC2 may receive different gate signals through different gate lines.

The transistors of the sub-pixel circuit SPC may include P-type transistors and/or N-type transistors. In embodiments, the transistors of the sub-pixel circuit SPC may include a Metal Oxide Silicon Field Effect Transistor (MOSFET). In embodiments, the transistors of the sub-pixel circuit SPC may include an amorphous silicon semiconductor, a monocrystalline silicon semiconductor, polycrystalline silicon semiconductor, an oxide semiconductor, and the like.

Figure 4:
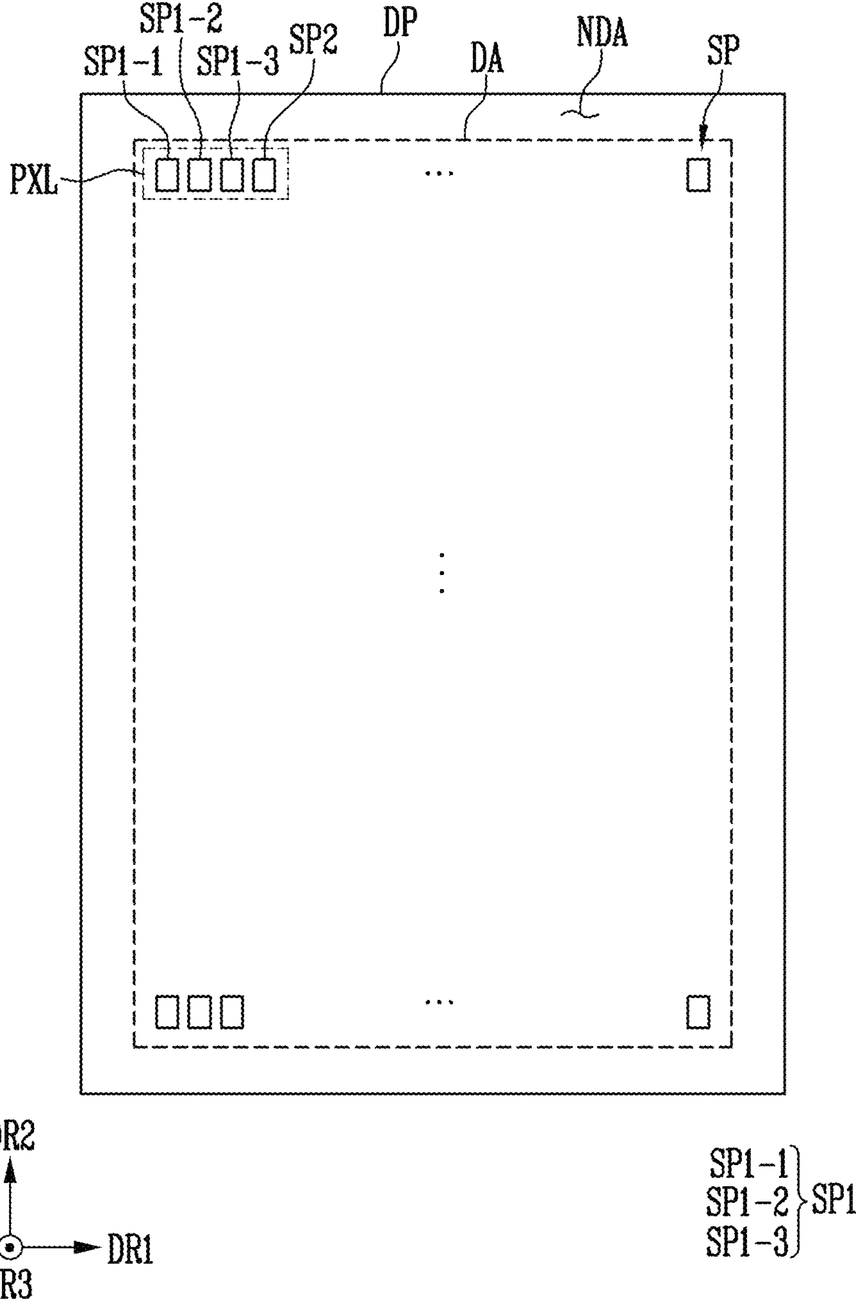
FIG. 4 is a plan view illustrating an embodiment of a display panel shown in FIG. 1.

FIG. 4 is a plan view illustrating an embodiment of the display panel shown in FIG. 1.

Referring to FIG. 4, a display panel DP may include a display area DA and a non-display area NDA. The display panel DP may display an image through the display area DA. The non-display area NDA may be disposed at the periphery of the display area DA.

The display panel DP may include sub-pixels SP in the display area DA. The sub-pixels SP may be arranged in a first direction DR1 and a second direction DR2 intersecting the first direction DR1. For example, the sub-pixels SP may be arranged in a matrix form in the first direction DR1 and in the second direction DR2. In an example, the sub-pixels SP may be arranged in a zigzag form in the first direction DR1 and the second direction DR2. The arrangement of the sub-pixels SP may vary in some embodiments. The first direction DR1 may be a row direction, and the second direction DR2 may be a column direction.

Two or more sub-pixels among the sub-pixels SP may constitute a pixel PXL. In FIG. 4, it may be illustrated that the pixel PXL includes four sub-pixels SP1-1 to SP1-3 and SP2. However, embodiments are not limited thereto. For example, the pixel PXL may include two sub-pixels. Hereinafter, for convenience of description, it may be assumed that the pixel PXL includes first sub-pixels SP1 and a second sub-pixel SP2.

Each of (1-1)th to (1-3)th sub-pixels SP1-1 to SP1-3 may generate light of one of various colors such as red, green, blue, cyan, magenta, and yellow. Hereinafter, for clear and simple description, it may be assumed that the (1-1)th sub-pixel SP1-1 may be configured to generate light of a red color, the (1-2)th sub-pixel SP1-2 may be configured to generate light of a green color, and the (1-3)th sub-pixel SP1-3 may be configured to generate light of a blue color.

The second sub-pixel SP2 may generate light of a white color. The second sub-pixel SP2 may display a white color so that the pixel PXL can implement a higher luminance.

Self-luminous display panels, such as a light emitting diode display panel (LED display panel) using a light emitting diode of micro scale or nano scale as a light emitting element and an organic light emitting display panel (OLED panel) using an organic light emitting diode as a light emitting element may be used as the display panel DP.

A component for controlling the sub-pixels SP may be disposed in the non-display area NDA. Lines electrically connected to the sub-pixels SP, e.g., the first to mth gate lines GL1 to GLm, the first to nth data lines DL1 to DLn, the power lines PL, and the pixel control lines PXCL, which may be shown in FIG. 1, may be disposed in the non-display area NDA.

At least one of the gate driver 120, the data driver 130, the voltage generator 140, and the controller 150, which may be shown in FIG. 1, may be disposed in the non-display area NDA of the display panel DP. In embodiments, the gate driver 120 may be disposed in the non-display area NDA. The data driver 130, the voltage generator 140, and the controller 150 may be implemented into the driver integrated circuit DIC shown in FIG. 1, which may be distinguished from the display panel DP, and the driver integrated circuit DIC may be electrically connected to the lines disposed in the non-display area NDA. In other embodiments, the gate driver 120, the data driver 130, the voltage generator 140, and the controller 150 may be implemented into an integrated circuit distinguished from the display panel DP.

In embodiments, the display area DA may have various shapes. The display area DA may have a closed-loop shape including linear sides and/or curved sides. For example, the display area DA may have shapes such as a polygon, a circle, a semicircle, and an ellipse.

In embodiments, the display panel DP may have an approximately flat display surface. In other embodiments, the display panel DP may at least partially have a round display surface. In embodiments, the display panel DP may be bendable, foldable or rollable. The display panel DP and/or a substrate of the display panel DP may include materials having flexibility.

Figure 5:
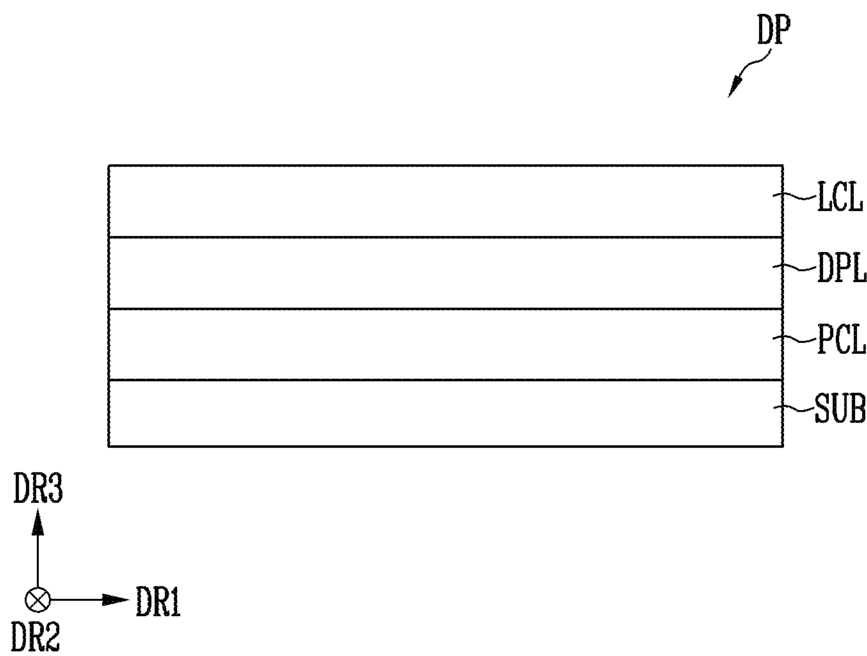
FIG. 5 is a schematic sectional view illustrating an embodiment of the display panel shown in FIG. 4.

FIG. 5 is a schematic sectional view illustrating an embodiment of the display panel shown in FIG. 4.

Referring to FIG. 5, a display panel DP may include a substrate SUB, and a pixel circuit layer PCL, a display panel layer DPL, and a light conversion layer LCL, which may be sequentially stacked on each other in a third direction DR3 intersecting the first and second directions DR1 and DR2 on the substrate SUB.

The substrate SUB may be made of an insulative material such as glass or resin. For example, the substrate SUB may include a glass substrate. In another example, the substrate SUB may include polyimide (PI) substrate. In still another example, the substrate SUB may include a silicon wafer substrate formed using a semiconductor process.

In embodiments, the substrate SUB may be made of a material having flexibility to be curvable or foldable, and may have a single-layer structure or a multi-layer structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, embodiments are not limited thereto.

The pixel circuit layer PCL may be disposed on the substrate SUB. The pixel circuit layer PCL may include insulating layers, semiconductor patterns, and conductive patterns, the semiconductor patterns and the conductive patterns may be disposed between the insulating layers. The conductive patterns of the pixel circuit layer PCL may serve as circuit elements, lines, and the like.

The circuit elements of the pixel circuit layer PCL may include the sub-pixel circuit SPC shown in FIGS. 2 and 3. In other words, the circuit elements of the pixel circuit layer PCL may be provided as transistors and one or more capacitors of the sub-pixel circuit SPC (see FIGS. 2 and 3).

The lines of the pixel circuit layer PCL may include lines electrically connected to each of the sub-pixels SP. The lines of the pixel circuit layer PCL may include various signal lines and/or various voltage lines which may be desirable for driving the display panel layer DPL.

The display panel layer DPL may be disposed on the pixel circuit layer PCL. The display panel layer DPL may include light emitting elements of the sub-pixels SP.

The light conversion layer LCL may be disposed on the display panel layer DPL. The light conversion layer LCL may include light conversion patterns having color conversion particles and/or light scattering particles. For example, color conversion particles may include quantum dots. The quantum dots may change a wavelength (or color) of light emitted from the display panel layer DPL. In embodiments, the light conversion patterns may be omitted.

The light conversion layer LCL may further include a color filter layer including color filters. The color filter may allow light having a specific wavelength (or specific color) to be selectively transmitted therethrough. In embodiments, the color filter layer may be omitted.

A window for protecting an exposed surface (or top surface) of the display panel DP may be provided on the light conversion layer LCL. The window may protect the display panel DP from external impact. The window may be bonded to the light conversion layer LCL through an optically transparent adhesive (or cohesive) member. The window may have a multi-layer structure selected from a glass substrate, a plastic film, and a plastic substrate. This multi-layer structure may be formed through a continuous process or an adhesive process using an adhesive layer. The whole or a portion of the window may have flexibility.

Figure 6:
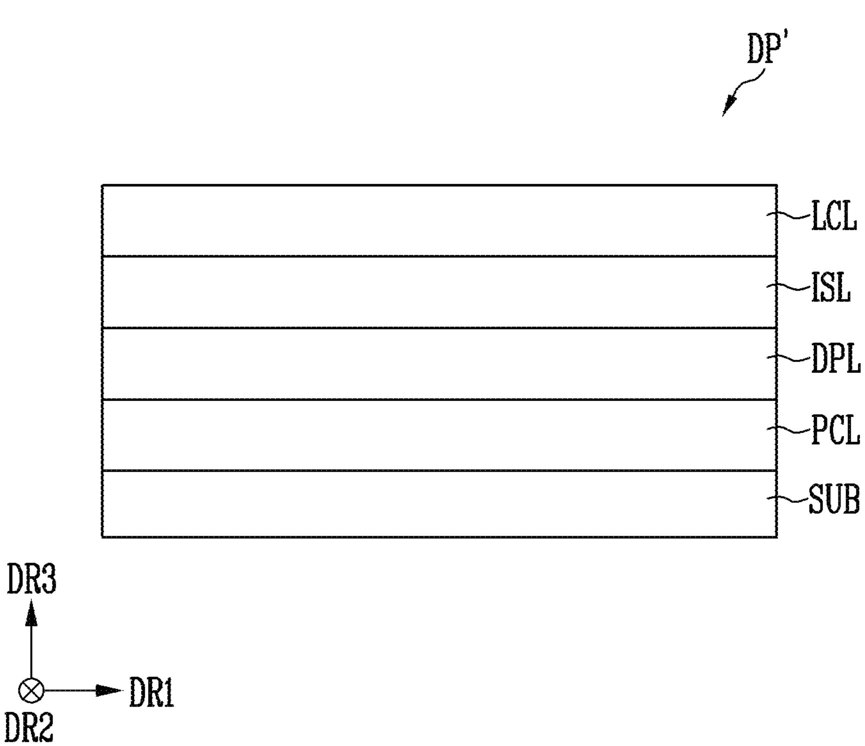
FIG. 6 is a schematic sectional view illustrating an embodiment of the display panel shown in FIG. 4.

FIG. 6 is a schematic sectional view illustrating an embodiment of the display panel shown in FIG. 4.

Referring to FIG. 6, a display panel DP' may include a substrate SUB, a pixel circuit layer PCL, a display panel layer DPL, an input sensing layer ISL, and a light conversion layer LCL. The substrate SUB, the pixel circuit layer PCL, the display panel layer DPL, and the light conversion layer LCL may be configured identically to the substrate SUB, the pixel circuit layer PCL, the display panel layer DPL, and the light conversion layer LCL, which may be described with reference to FIG. 5, respectively. Hereinafter, overlapping descriptions will be omitted.

The input sensing layer ISL may sense a user input with respect to a top surface (or display surface) of the display panel DP'. The input sensing layer ISL may include components suitable for sensing an external object such as a hand of a user or a pen. For example, the input sensing layer ISL may include touch electrodes.

Figure 7:
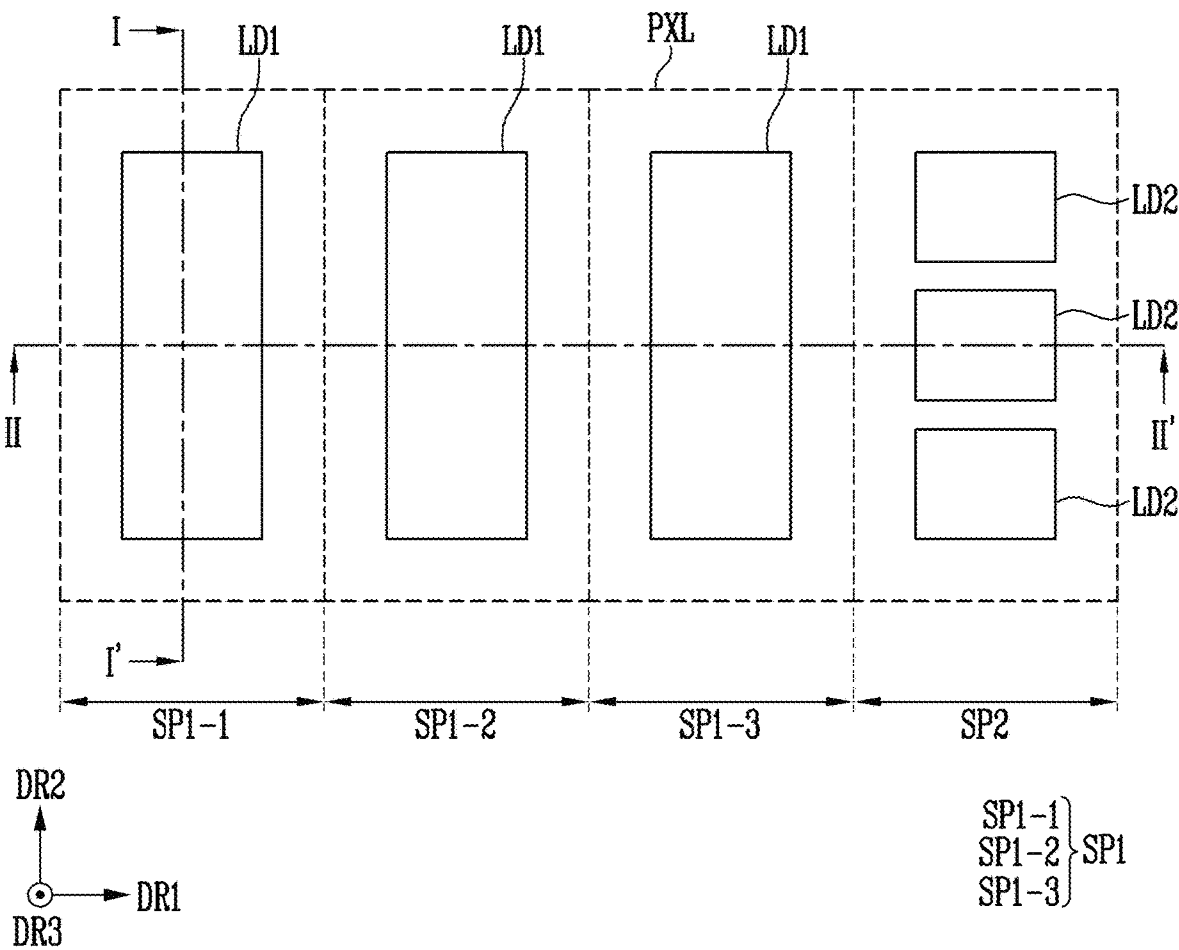
FIG. 7 is a plan view illustrating an embodiment of any one of pixels shown in FIG. 4.

FIG. 7 is a plan view illustrating an embodiment of any one of the pixels shown in FIG. 4.

Referring to FIG. 7, a pixel PXL may include first sub-pixels SP1 and a second sub-pixel SP2. The first sub-pixels SP1 and the second sub-pixel SP2 may be arranged in the first direction DR1. However, the arrangement of the pixel PXL is not limited thereto, and may be variously changed in some embodiments. For example, the first sub-pixels SP1 and the second sub-pixel SP2 may be arranged in zigzag.

The first sub-pixels SP1 may include (1-1)th to (1-3)th sub-pixels SP1-1 to SP1-3. Each of the (1-1)th to (1-3)th sub-pixels SP1-1 to SP1-3 may include a first light emitting element LD1.

The second sub-pixel SP2 may include multiple second light emitting elements LD2. The second light emitting elements LD2 may be arranged in the second direction DR2. However, the arrangement of the second light emitting elements LD2 is not limited thereto, and may be variously changed in some embodiments.

The second light emitting element LD2 may be smaller than the first light emitting element LD1. The second sub-pixel SP2 may include multiple second light emitting elements LD2, each of which may be smaller than the first light emitting element LD1 so that a higher luminance can be implemented in the same area.

In an embodiment, the second light emitting elements LD2 may display the same color as the first light emitting element LD1. For example, the first light emitting elements LD1 and the second light emitting elements LD2 may display a blue color.

The first light emitting element LD1 and the second light emitting element LD2 may be inorganic light emitting diodes including an inorganic light emitting material. However, embodiments are not limited thereto. For example, organic light emitting diodes may be used as the first light emitting element LD1 and the second light emitting element LD2.

Figure 8:
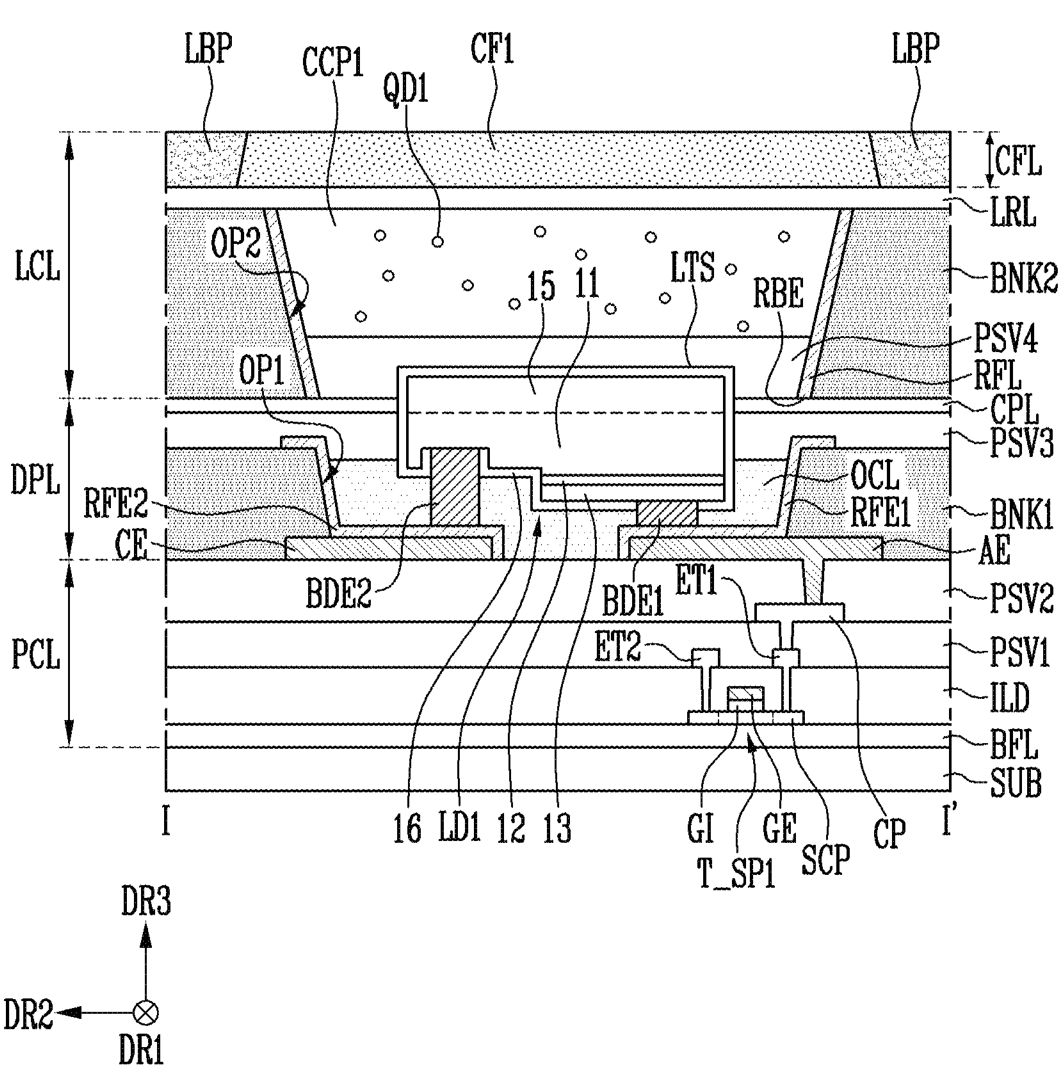
FIG. 8 is a schematic sectional view taken along line I-I' shown in FIG. 7.

FIG. 8 is a schematic sectional view taken along line I-I' shown in FIG. 7.

Referring to FIG. 8, a pixel circuit layer PCL, a display panel layer DPL, and a light conversion layer LCL may be sequentially disposed on a substrate SUB.

The pixel circuit layer PCL may include insulating layers, semiconductor patterns, and conductive patterns, which may be stacked on each other on the substrate SUB. The insulating layers may include a buffer layer BFL, one or more interlayer insulating layers ILD, and one or more passivation layers PSV1 and PSV2. The semiconductor patterns and the conductive patterns may be located between the insulating layers. The conductive patterns may include at least one material among copper (Cu), molybdenum (Mo), tungsten (W), aluminum neodymium (AlNd), titanium (Ti), aluminum (Al), and silver (Ag).

As described above, the sub-pixel circuit SPC (see FIGS. 2 and 3) of each of the first and second sub-pixels SP1 and SP2 (see FIGS. 2 and 3) may include transistors and one or more capacitors. The semiconductor patterns and the conductive patterns of the pixel circuit layer PCL may serve as the transistors and the capacitors of the sub-pixel circuit SPC (see FIGS. 2 and 3). The conductive patterns of the pixel circuit layer PCL may further serve as lines, e.g., the first to mth gate lines GL1 to GLm (see FIG. 1), the first to nth data lines DL1 to DLn (see FIG. 1), the power lines PL (see FIG. 1), and the pixel control lines PXCL (see FIG. 1).

The buffer layer BFL may be disposed on a surface of the substrate SUB. The buffer layer BFL may prevent an impurity from being diffused into circuit elements and lines, which may be included in the pixel circuit layer PCL. The buffer layer BFL may include an inorganic insulating layer including an inorganic material. In embodiments, the buffer layer BFL may include at least one of silicon nitride ($SiN_x$), silicon oxide ($SiO_x$), silicon oxynitride ($SiO_xN_y$), and a metal oxide such as aluminum oxide ($AlO_x$). The buffer layer BFL may be provided as a single layer or a multi-layer. In case that the buffer layer BFL is provided as the multi-layer, layers of the multi-layer may be formed of a same material or be formed of different materials.

In embodiments, one or more barrier layers may be disposed between the substrate SUB and the buffer layer BFL. Each of the barrier layers may include polyimide.

A transistor T_SP1 may be disposed on the buffer layer BFL. The transistor T_SP1 may be any one of the transistors of the sub-pixel circuit SPC included in the first sub-pixel SP1. For example, the transistor T_SP1 may be understood as a transistor electrically connected to an anode electrode AE among the transistors of the sub-pixel circuit SPC.

The transistor T_SP1 may include a semiconductor pattern SCP, a gate electrode GE, a first terminal ET1, and a second terminal ET2. The first terminal ET1 may be any one of a source electrode and a drain electrode, and the second terminal ET2 may be another of the source electrode and the drain electrode. For example, the first terminal ET1 may be the source electrode, and the second terminal ET2 may be the drain electrode.

The semiconductor pattern SCP may be disposed on the buffer layer BFL. The semiconductor pattern SCP may include a first contact region in contact with the first terminal ET1 and a second contact region in contact with the second terminal ET2. A region between the first contact region and the second contact region may be a channel region. The channel region may overlap the gate electrode GE of the transistor T_SP1. The channel region may be a semiconductor pattern undoped with an impurity, and may be an intrinsic semiconductor. Each of the first contact region and the second contact region may be a semiconductor pattern doped with the impurity. For example, a p-type impurity may be used as the impurity, but embodiments are not limited thereto.

The semiconductor pattern SCP may include any one of various types of semiconductors, e.g., any one of an amorphous silicon semiconductor, a monocrystalline silicon semiconductor, a polycrystalline silicon semiconductor, a low temperature poly-silicon semiconductor, and an oxide semiconductor.

The interlayer insulating layers ILD may be disposed over the semiconductor pattern SCP. The interlayer insulating layers ILD may include inorganic insulating layers including an inorganic material sequentially stacked on each other. For example, each of the interlayer insulating layers ILD may include at least one of silicon nitride ($SiN_x$), silicon oxide ($SiO_x$), silicon oxynitride ($SiO_xN_y$), and a metal oxide such as aluminum oxide ($AlO_x$). However, the interlayer insulating layers ILD are not limited thereto. For example, any one of the interlayer insulating layers ILD may include an organic insulating layer including an organic material.

The interlayer insulating layers ILD may electrically separate the conductive patterns and/or the semiconductor patterns, which may be disposed between the interlayer insulating layers ILD. For example, the interlayer insulating layers ILD may include a gate insulating layer GI disposed on the semiconductor pattern SCP. The gate insulating layer GI may be disposed between the semiconductor pattern SCP and the gate electrode GE such that the gate electrode GE may be spaced apart from the semiconductor pattern SCP. In embodiments, the gate insulating layer GI may be entirely provided on the semiconductor pattern SCP and the buffer layer BFL to cover the semiconductor pattern SCP and the buffer layer BFL. As the number of layers required in the conductive patterns and/or the semiconductor patterns increases, the number of interlayer insulating layers ILD may increase.

The gate electrode GE may be disposed on the gate insulating layer GI. The gate electrode GE may be provided as a single layer including at least one material among copper (Cu), molybdenum (Mo), tungsten (W), aluminum neodymium (AlNd), titanium (Ti), aluminum (Al), and silver (Ag). In embodiments, the gate electrode GE may be provided as a multi-layer including at least one material among molybdenum (Mo), titanium (Ti), copper (Cu), aluminum (Al), and silver (Ag), which may be low resistance materials.

The first and second terminals ET1 and ET2 may be disposed on the interlayer insulating layers ILD. The first and second terminals ET1 and ET2 may be in contact with the semiconductor pattern SCP through contact holes penetrating the interlayer insulating layers ILD. The first and second terminals ET1 and ET2 may be in contact with the first and second contact regions of the semiconductor pattern SCP, respectively. Each of the first and second terminals ET1 and ET2 may include at least one material among copper (Cu), molybdenum (Mo), tungsten (W), aluminum neodymium (AlNd), titanium (Ti), aluminum (Al), and silver (Ag).

Although the first and second terminals ET1 and ET2 may be illustrated as separate electrodes electrically connected to the semiconductor pattern SCP, embodiments are not limited thereto. In some embodiments, the first terminal ET1 may be the first contact region adjacent to a side of the channel region of the semiconductor pattern SCP, and the second terminal ET2 may be the second contact region adjacent to another side of the channel region of the semiconductor pattern SCP. The first terminal ET1 may be electrically connected to the first light emitting element LD1 through a connection means such as a bridge electrode disposed on at least one of the interlayer insulating layers ILD.

In embodiments, the transistor T_SP1 may be configured as a low temperature poly-silicon transistor. However, embodiments are not limited thereto. For example, the transistor T_SP1 may be configured as an oxide semiconductor transistor. In embodiments, the sub-pixel circuit of the first sub-pixel SP1 may include different types of transistors. For example, the transistor T_SP1 may be configured as a low temperature poly-silicon transistor, and another transistor of the first sub-pixel SP1 may be configured as an oxide semiconductor transistor. An oxide semiconductor of the corresponding oxide semiconductor transistor may be disposed on any one of the interlayer insulating layers ILD instead of an insulating layer on which the semiconductor pattern SCP of the transistor T_SP1.

In embodiments, a case where the transistor T_SP1 may be a transistor having a top gate structure may be described as an example. However, embodiments are not limited thereto. For example, the transistor T_SP1 may be a transistor having a bottom gate structure. The structure of the transistor T_SP1 may be variously changed.

At least a portion of various lines of the display panel DP and/or the display device DD may be further disposed on the interlayer insulating layers ILD.

A first passivation layer PSV1 may be disposed over first to third transistors T_SP1 to T_SP3. The passivation layer may be designated as a protective layer or a via layer. The first passivation layer PSV1 may protect components disposed thereunder, and provide an approximately flat top surface.

A connection pattern CP may be disposed on the first passivation layer PSV1. The connection pattern CP may be electrically connected to the first terminal ET1 of the transistor T_SP1 while penetrating the first passivation layer PSV1. The connection pattern CP may include at least one material among copper (Cu), molybdenum (Mo), tungsten (W), aluminum neodymium (AlNd), titanium (Ti), aluminum (Al), and silver (Ag).

At least a portion of various lines of the display panel DP and/or the display device DD may be further disposed on the first passivation layer PSV1.

A second passivation layer PSV2 may be disposed on the connection pattern CP and the first passivation layer PSV1. The second passivation layer PSV2 may protect components disposed thereunder, and provide an approximately flat top surface.

Each of the first and second passivation layers PSV1 and PSV2 may include an inorganic insulating layer including an inorganic material and/or an organic insulating layer including an organic material. The inorganic insulating layer may include, for example, at least one of silicon oxide ($SiO_x$), silicon nitride ($SiN_x$), silicon oxynitride ($SiO_xN_y$), and a metal oxide such as aluminum oxide ($AlO_x$). The organic insulating layer may include, for example, at least one of acrylic resin, epoxy resin, phenolic resin, polyamide resin, polyimide resin, unsaturated polyester resin, poly-phenylene ether resin, poly-phenylene sulfide resin, and benzocyclobutene resin.

The first and second passivation layers PSV1 and PSV2 and any one of the interlayer insulating layers ILD may include a same material, but embodiments are not limited thereto. Each of the first and second passivation layers PSV1 and PSV2 may be provided as a single layer, but also may be provided as a multi-layer.

The display panel layer DPL may be disposed on the second passivation layer PSV2. The display panel layer DPL may include the anode electrode AE, a cathode electrode CE, a first bank BNK1, first and second reflective electrodes RFE1 and RFE2, the first light emitting element LD1, an overcoat layer OCL, a third passivation layer PSV3, and a capping layer CPL.

The anode electrode AE and the cathode layer CE may be disposed on the pixel circuit layer PCL.

The anode electrode AE may be electrically connected to the connection pattern CP through a contact hole penetrating the second passivation layer PSV2. As such, the anode electrode AE may be electrically connected to the first transistor T_SP1.

The cathode electrode CE may be spaced apart from the anode electrode AE in the second direction DR2. The cathode electrode CE may be electrically connected to the second power voltage node VSSN shown in FIG. 2. Accordingly, the second power voltage applied to the second power voltage node VSSN may be transferred to the cathode electrode CE.

The first bank BNK1 may be disposed on the anode electrode AE and the cathode electrode CE. The first bank BNK1 may have a first opening OP1 exposing portions of the anode electrode AE and the cathode electrode CE. The first light emitting element LD1 may be disposed in the first opening OP1 of the first bank BNK1. As such, the first bank BNK1 may be provided as a pixel defining layer defining an area in which the first light emitting element LD1 may be located.

The first bank BNK1 may be configured to include a light blocking material to prevent light mixture between adjacent sub-pixels. In embodiments, the first bank BNK1 may include an organic material. For example, the first bank BNK1 may include an organic insulating material such as acrylic resin, epoxy resin, phenolic resin, polyamide resin, or polyimide resin.

The first reflective electrode RFE1 may be disposed on the exposed portion of the anode electrode AE and a side surface of the first bank BNK1, which may be adjacent thereto. The second reflective electrode RFE2 may be disposed on the exposed portion and a side surface of the first bank BNK1, which may be adjacent thereto. The first and second reflective electrodes RFE1 and RFE2 may include conductive materials suitable for reflecting light. Accordingly, the light emission efficiency of the first light emitting element LD1 can be improved. In embodiments, the first and second reflective electrodes RFE1 and RFE2 may include at least one of aluminum (Al), silver (Ag), magnesium (Mg), platinum (Pt), palladium (Pd), gold (Au), nickel (Ni), neodymium (Nd), iridium (Ir), chromium (Cr), titanium (Ti), and alloys of two or more materials selected therefrom. However, embodiments are not limited thereto.

The first light emitting element LD1 may be electrically connected to the anode electrode AE through the first reflective electrode RFE1. The first light emitting element LD1 may be electrically connected to the cathode electrode CE through the second reflective electrode RFE2. The first light emitting element LD1 may be bonded and electrically connected to the first and second reflective electrodes RFE1 and RFE2.

The first light emitting element LD1 may include a first semiconductor layer 11, an active layer 12, a second semiconductor layer 13, and an auxiliary layer 15. The first light emitting element LD1 may include a light emitting stack structure in which the auxiliary layer 15, the first semiconductor layer 11, the active layer 12, and the second semiconductor layer 13 may be sequentially stacked on each other.

The first light emitting element LD1 includes first and second bonding electrodes BDE1 and BDE2 facing in the same direction (e.g., the opposite direction of the third direction DR3). The first bonding electrode BDE1 may be electrically connected to the second semiconductor layer 13. The second bonding electrode BDE2 may be electrically connected to the first semiconductor layer 11 exposed by the second semiconductor layer 13 and the active layer 12. The first light emitting element LD1 may be a flip chip type light emitting element.

The first semiconductor layer 11 may be configured to provide electrons to the active layer 12. The first semiconductor layer 11 may include, for example, at least one n-type semiconductor layer. For example, the first semiconductor layer 11 may include any one semiconductor material among gallium nitride (GaN), aluminum gallium nitride (AlGaN), indium gallium nitride (InGaN), aluminum nitride (AlN), and indium nitride (InN), and be an n-type semiconductor layer doped with a first conductive dopant (or n-type dopant) such as silicon (Si), germanium (Ge) or tin (Sn). However, the material constituting the first semiconductor layer 11 is not limited thereto. Various materials may constitute the first semiconductor layer 11. In an embodiment of the disclosure, the first semiconductor layer 11 may include a gallium nitride (GaN) semiconductor material doped with the first conductive dopant (or n-type dopant). In some embodiments, the first semiconductor layer 11 along with the auxiliary layer 15 may constitute an n-type semiconductor layer.

The active layer 12 may be disposed on the first semiconductor layer 11, and may be an area in which electrons and holes may be recombined. As electrons and holes may be recombined in the active layer, light may be generated, which has a level changed to a low energy level and has a wavelength corresponding to the low energy level. In case that the active layer 12 is formed in the multi-quantum well structure, a unit including a barrier layer, a strain reinforcing layer, and a well layer may be repeatedly stacked on each other to form the active layer 12. However, embodiments of the active layer 12 are not limited thereto.

The second semiconductor layer 13 may be disposed on the active layer 12, and may provide holes to the active layer 12. The second semiconductor layer 13 may include a semiconductor layer of which type may be different from the type of the first semiconductor layer 11. In an example, the second semiconductor layer 13 may include at least one p-type semiconductor layer. For example, the second semiconductor layer 13 may include any one semiconductor material among gallium nitride (GaN), aluminum gallium nitride (AlGaN), indium gallium nitride (InGaN), aluminum nitride (AlN), and indium nitride (InN), and be a p-type semiconductor layer doped with a second conductive dopant (or p-type dopant) such as magnesium (Mg), zinc (Zn), calcium (Ca), strontium (Sr) or barium (Ba). However, the material constituting the second semiconductor layer 13 is not limited thereto. Various materials may constitute the second semiconductor layer 13. In an embodiment of the disclosure, the second semiconductor layer 13 may include a gallium nitride (GaN) semiconductor material doped with the second conductive dopant (or p-type dopant).

The auxiliary layer 15 may include a gallium nitride (GaN) semiconductor material undoped with an impurity. The auxiliary layer 15 along with the first semiconductor layer 11 may constitute an n-type semiconductor layer.

The first bonding electrode BDE1 may be electrically connected to the second semiconductor layer 13. The second bonding electrode BDE2 may be electrically connected to the first semiconductor layer 11. The first and second bonding electrodes BDE1 and BDE2 may include a eutectic metal.

The first light emitting element LD1 may further include an insulative film 16 covering an outer circumferential surface of the light emitting stack structure. The insulative film 16 may prevent an electrical short circuit which may occur while the active layer 12 may be in contact with another conductive material except the first and second semiconductor layers 11 and 13. The insulative film 16 may include a transparent insulating material. The insulative film 16 may be configured to expose bottom surfaces of the first and second bonding electrodes BDE1 and BDE2.

The bottom surface of the first bonding electrode BDE1 may be in contact with the first reflective electrode RFE1. Accordingly, the first bonding electrode BDE1 may be electrically connected to the anode electrode AE through the first reflective electrode RFE1. The bottom surface of the second bonding electrode BDE2 may be in contact with the second reflective electrode RFE2. Accordingly, the second bonding electrode BDE2 may be electrically connected to the cathode electrode CE through the second reflective electrode RFE2.

The overcoat layer OCL may be disposed in the first opening OP1 in which the first and second reflective electrodes RFE1 and RFE2 and the first light emitting element LD1 are disposed. The overcoat layer OCL may prevent movement and fix the first light emitting element LD1 bonded to the first and second reflective electrodes REF1 and RFE2. Also, the overcoat layer OCL may protect components disposed thereunder from a foreign material such as dust or moisture. For example, the overcoat layer OCL may include at least one of an inorganic insulating layer and an organic insulating layer. For example, the overcoat layer OCL may include epoxy, but embodiments are not limited thereto.

The third passivation layer PSV3 may be disposed over the first bank BNK1 and the overcoat layer OCL. The third passivation layer PSV3 may protect components disposed thereunder, and provide an approximately flat surface. The third passivation layer PSV3 and any one of the first and second passivation layers PSV1 and PSV2 may include a same material, but embodiments are not limited thereto.

In embodiments, the third passivation layer PSV3 may not be disposed on a top surface LTS of the first light emitting element LD1. The first light emitting element LD1 may protrude to the light conversion layer LCL. The first light emitting element LD1 may be at least partially located in a second opening OP2 of a second bank BNK2. For example, a height of the top surface LTS of the first light emitting element LD1 from the substrate SUB may be higher than a height of a lowermost end RBE of a reflective layer RFL from the substrate SUB. Accordingly, light emitted from the first light emitting element LD1 may be provided to the light conversion layer LCL at a relatively high ratio.

The capping layer CPL may be disposed on the third passivation layer PSV3. The capping layer CPL may protect components disposed thereunder, such as the first light emitting element LD1, from external moisture, humidity, and the like. In embodiments, the capping layer CPL may not be disposed on the top surface of the first light emitting element LD1. In other embodiments, the capping layer CPL may entirely cover the first light emitting element LD1 and the third passivation layer PSV3. The capping layer CPL may include at least one of silicon nitride ($SiN_x$), silicon oxide ($SiO_x$), silicon oxynitride ($SiO_xN_y$), and a metal oxide such as aluminum oxide ($AlO_x$). However, the material of the capping layer CPL is not limited thereto.

In the above, the pixel circuit layer PCL and the display panel layer DPL of the (1-1)th sub-pixel SP1-1 have been described. Each of the (1-2)th and (1-3)th sub-pixels SP1-2 and SP1-3 shown in FIG. 7 may also be configured identically to the (1-1)th sub-pixel SP1-1 in a range in which it may not be differently described herein. Similarly, the second sub-pixel SP2 may also be configured identically to the (1-1)th sub-pixel SP1-1 in a range in which it may not be differently described herein.

The light conversion layer LCL may be disposed on the capping layer CPL. The light conversion layer LCL may include the second bank BNK2, the reflective layer RFL, a fourth passivation layer PSV4, a first light conversion pattern CCP1, a low refractive layer LRL, and a color filter layer CFL.

The second bank BNK2 may be disposed on the capping layer CPL. The second bank BNK2 may overlap the first bank BNK1. The second bank BNK2 may have the second opening OP2 overlapping with the first opening OP1.

The second bank BNK2 may be configured to include a light blocking material to prevent light mixture between adjacent sub-pixels. In embodiments, the second bank BNK2 may include an organic material. For example, the second bank BNK2 may include an organic insulating material such as acrylic resin, epoxy resin, phenolic resin, polyamide resin, polyimide resin, or a combination thereof.

The reflective layer RFL may be disposed on side surfaces of the second bank BNK2, which may be adjacent to the second opening OP2. The reflective layer RFL may be configured to reflect incident light, and accordingly, light emission efficiency can be improved. The reflective layer RFL may include a material suitable for reflecting light. The reflective layer RFL may include at least one of aluminum (Al), silver (Ag), magnesium (Mg), platinum (Pt), palladium (Pd), gold (Au), nickel (Ni), neodymium (Nd), iridium (Ir), chromium (Cr), titanium (Ti), and alloys of two or more materials selected therefrom. However, embodiments are not limited thereto.

On the capping layer CPL, the fourth passivation layer PSV4 may be disposed in the second opening OP2. The fourth passivation layer PSV4 may protect components disposed thereunder, and may provide an approximately flat surface. The fourth passivation layer PSV4 and any one of the first to third passivation layers PSV1 to PSV3 may include a same material, but embodiments are not limited thereto.

On the fourth passivation layer PSV4, the first light conversion pattern CCP1 may be disposed in the second opening OP2.

The first light conversion pattern CCP1 may include color conversion particles and/or light scattering particles. The color conversion particles may convert incident light into light of another color by changing a wavelength of the incident light. Also, the color conversion particles may scatter incident light. In embodiments, the color conversion particles may be quantum dots. The light scattering particles may scatter incident light.

The (1-1)th sub-pixel SP1-1 may be a red sub-pixel. In case that the first light emitting element LD1 emits light of a blue color, the first light conversion pattern CCP1 may include first color conversion particles QD1 configured to convert light of the blue color into light of a red color. In case that the first light emitting element LD1 emits light of the red color, the first light conversion pattern CCP1 may include light scattering particles. As such, the particles included in the first light conversion pattern CCP1 may be variously changed according to the first light emitting element LD1.

The low refractive layer LRL may be disposed on the second bank BNK2, the reflective layer RFL, and the first light conversion pattern CCP1. The low refractive layer LRL may have a refractive index lower than a refractive index of each of the first light conversion pattern CCP1 and a first color filter CF1. The low refractive layer LRL may be configured to refract or totally reflect light according to an incident angle of the corresponding light. For example, the low refractive layer LRL may again provide light passing through the first light conversion pattern CCP1 to the first light conversion pattern CCP1. Accordingly, the light conversion efficiency of the first light conversion pattern CCP1 can be improved.

The color filter layer CFL may be disposed on the low refractive layer LRL. The color filter layer CFL may include the first color filter CF1 and light blocking patterns LBP. The first color filter CF1 may overlap the first light conversion pattern CCP1. The first color filter CF1 may allow light in a desired wavelength range to be selectively transmitted therethrough. In case that the (1-1)th sub-pixel SP1-1 is a red sub-pixel, the first color filter CF1 may include a red color filter. The light blocking patterns LBP may include at least one of various kinds of light blocking materials.

Figure 9:
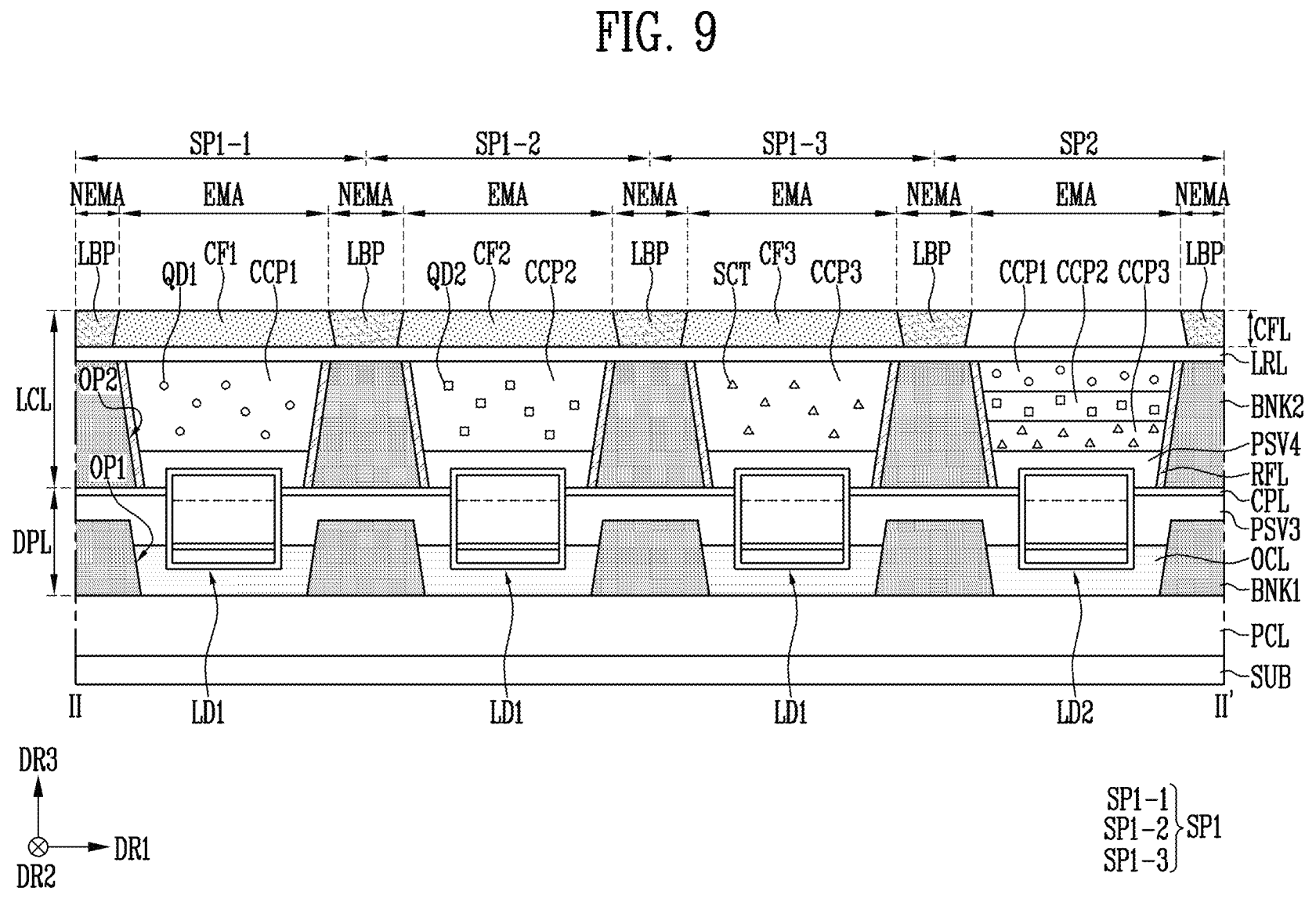

FIG. 9 is a schematic sectional view taken along line II-II' shown in FIG. 7.

Referring to FIGS. 7 and 9, a pixel circuit layer PCL, a display panel layer DPL, and a light conversion layer LCL may be provided on a substrate SUB.

The pixel circuit layer PCL and the display panel layer DPL may be the same as described with reference to FIG. 8. In the pixel circuit layer PCL, sub-pixel circuits respectively corresponding to the first sub-pixels SP1 and the second sub-pixel SP2 may be provided. In the display panel layer DPL, first light emitting elements LD1 respectively corresponding to the (1-1)th to (1-3)th sub-pixels SP1-1 to SP1-3 may be provided. In the display panel layer DPL, a second light emitting element LD2 corresponding to the second sub-pixel SP2 may be provided. The first and second light emitting elements LD1 and LD2 may overlap first openings OP1 of a first bank BNK1. The first light emitting element LD1 may be electrically connected between a cathode electrode CE (see FIG. 8) and a transistor included in a sub-pixel circuit SPC (see FIG. 2) of one of the (1-1)th to (1-3)th sub-pixels SP1-1 to SP1-3. The second light emitting element LD2 may be electrically connected between a cathode electrode CE and a transistor included in a sub-pixel circuit SPC (see FIG. 3) of the second sub-pixel SP2. Hereinafter, overlapping descriptions will be omitted.

The light conversion layer LCL may be provided on the display panel layer DPL. The light conversion layer LCL may be the same as described with reference to FIG. 8. Hereinafter, overlapping descriptions will be omitted.

A second bank BNK2 may have second openings OP2. It may be understood that emission areas EMA and a non-emission area NEMA of the first and second sub-pixels SP1 and SP2 may be defined by the second bank BNK2. An area which the second bank BNK2 overlaps may correspond to the non-emission area NEMA. Areas overlapping the second openings OP2 of the second bank BNK2 may correspond to the emission areas EMA of the first and second sub-pixels SP1 and SP2.

On a capping layer CPL, a fourth passivation layer PSV4 may be disposed in the second openings OP2. On the fourth passivation layer PSV4, first to third light conversion patterns CCP1 to CCP3 may be disposed in the second openings OP2.

In embodiments, the first light emitting elements LD1 may be configured to emit light of a blue color. The first light conversion pattern CCP1 may include first color conversion particles QD1 configured to convert light of the blue color into light of a red color. The second light conversion pattern CCP2 may include second color conversion particles QD2 configured to convert light of the blue color into light of a green color. The third light conversion pattern CCP3 may include light scattering particles SCT which scatter light of the blue color to improve light emission efficiency. Accordingly, the (1-1)th to (1-3)th sub-pixels SP1-1 to SP1-3 may be provided as a red sub-pixel, a green sub-pixel, and a blue sub-pixel, respectively.

In embodiments, the second light emitting element LD2 may be configured to emit light of the blue color. A light conversion pattern disposed in the second sub-pixel SP2 may convert light of the blue color into light of a white color. For example, the first to third light conversion patterns CCP1 to CCP3 may be disposed in the second sub-pixel SP2. For example, the first to third light conversion patterns CCP1 to CCP3 in the second sub-pixel SP2 may overlap each other in the third direction DR3. Accordingly, the light conversion pattern of the second sub-pixel SP2 may convert light of the blue color into light of the white color.

The particles included in the first to third light conversion patterns CCP1 to CCP3 may be variously changed according to the first and second light emitting elements LD1 and LD2.

In embodiments, the first to third light conversion patterns CCP1 to CCP3 may be omitted.

A low refractive layer LRL may be disposed on the second bank BNK2, a reflective layer RFL, and the first to third light conversion patterns CCP1 to CCP3. The low refractive layer LRL may have a refractive index lower than a refractive index of each of the first to third light conversion patterns CCP1 to CCP3 and first to third color filters CF1 to CF3. In embodiments, the low refractive layer LRL may be omitted in an area corresponding to the second sub-pixel SP2.

A color filter layer CFL may be disposed on the low refractive layer LRL. The color filter layer CFL may include the first to third color filters CF1 to CF3 and light blocking patterns LBP.

Each of the first to third color filters CF1 to CF3 may allow light in a desired wavelength range to be selectively transmitted therethrough. In case that the (1-1)th sub-pixel SP1-1 is a red sub-pixel, the first color filter CF1 may include a red color filter. In case that the (1-2)th sub-pixel SP1-2 is a green sub-pixel, the second color filter CF2 may include a green color filter. In case that the (1-3)th sub-pixel SP1-3 is a blue sub-pixel, the third color filter CF3 may include a blue color filter.

The light blocking patterns LBP may be disposed between the color filters CF1 to CF3. It may be understood that the emission areas (or light emission areas) EMA and the non-emission area NEMA of the first and second sub-pixels SP1 and SP2 may be defined by the light blocking patterns LBP. Areas corresponding to the light blocking patterns LBP may correspond to the non-emission area NEMA. Areas not overlapping the light blocking patterns LBP may correspond to the emission areas EMA.

In an embodiment, the first to third color filters CF1 to CF3 may not be disposed in the second sub-pixel SP2. Since the second sub-pixel SP2 displays the white color, any color filter may not be required.

In embodiments, the light blocking patterns LBP may include at least one of various kinds of light blocking materials. In embodiments, each of the light blocking patterns LBP may be provided in the form of a multi-layer that may include at least two color filters among the first to third color filters CF1 to CF3 that overlap each other. For example, each of the light blocking patterns LBP may be formed as the first to third color filters CF1 to CF3 overlapping each other. In another example, a light blocking pattern between the first and second color filters CF1 and CF2 among the light blocking patterns LBP may be formed as a multi-layer in which the first and second color filters CF1 and CF2 may overlap, and a light blocking pattern between the second and third color filters CF2 and CF3 among the light blocking patterns LBP may be formed as a multi-layer in which the second and third color filters CF2 and CF3 may overlap. A light blocking pattern between the first color filter CF1 and a third color filter CF3 of an adjacent pixel may be formed as a multi-layer in which the first and third color filters CF1 and CF3 may overlap. As such, each of the first to third color filters CF1 to CF3 may extend to the non-emission area NEMA to form the light blocking patterns LBP.

Figure 10:
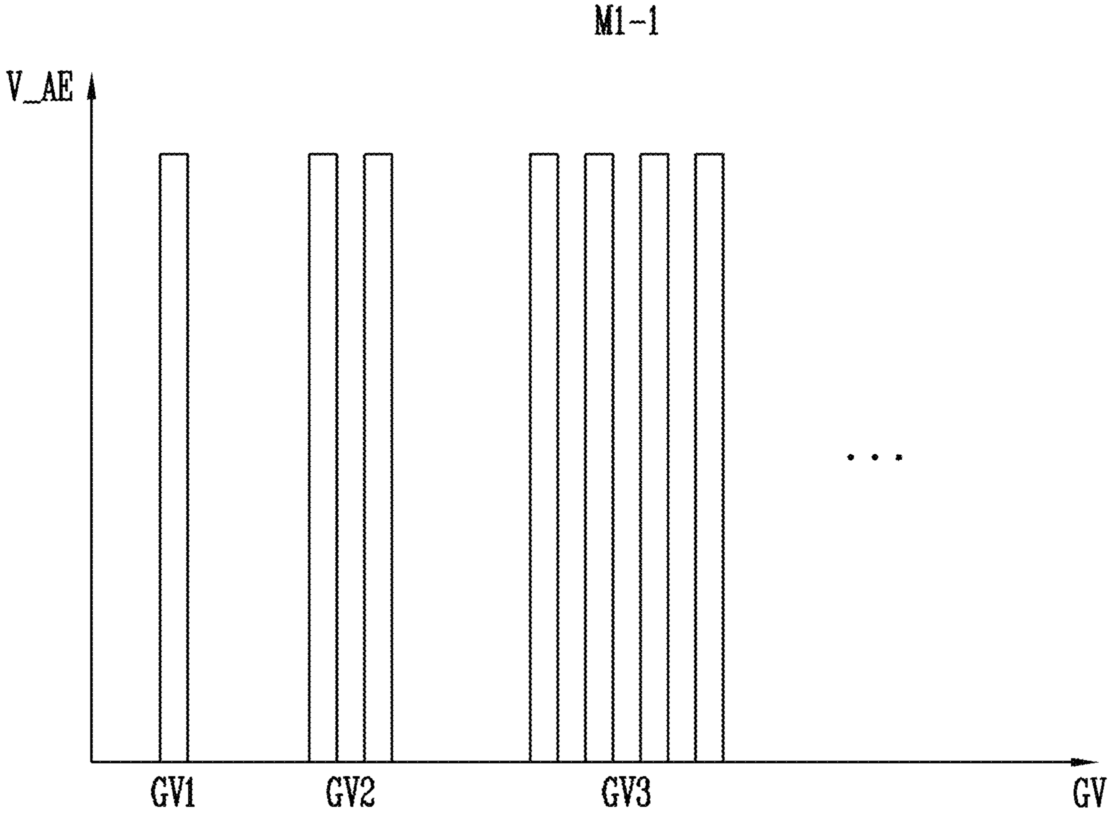
FIG. 10 is a graph illustrating an example in which the display panel of the display device shown in FIG. 1 operates in a (1-1)th mode.
Figure 11:
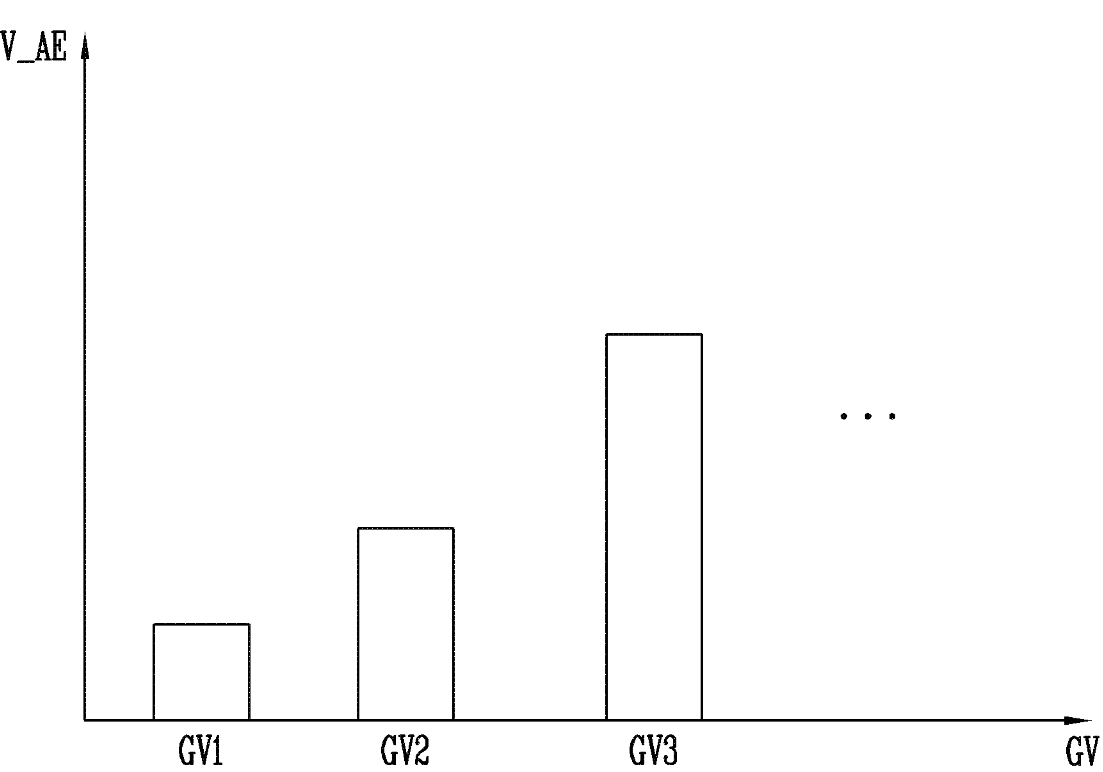
FIG. 11 is a graph illustrating an example in which the display panel of the display device shown in FIG. 1 operates in a (1-2)th mode.
Figure 12:
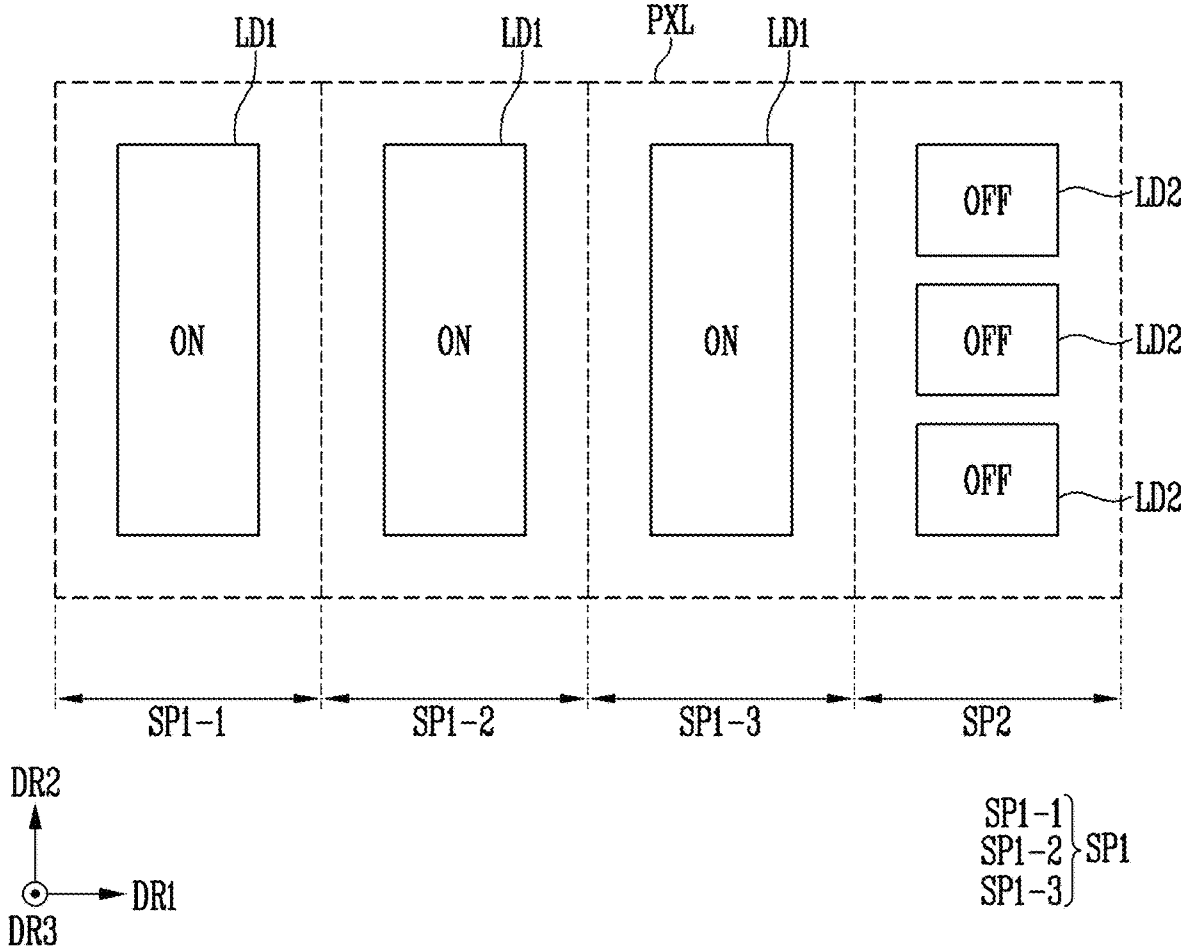
FIG. 12 is a graph illustrating an example in which the sub-pixels of the display device shown in FIG. 1 operate in a first mode.
Figure 13:
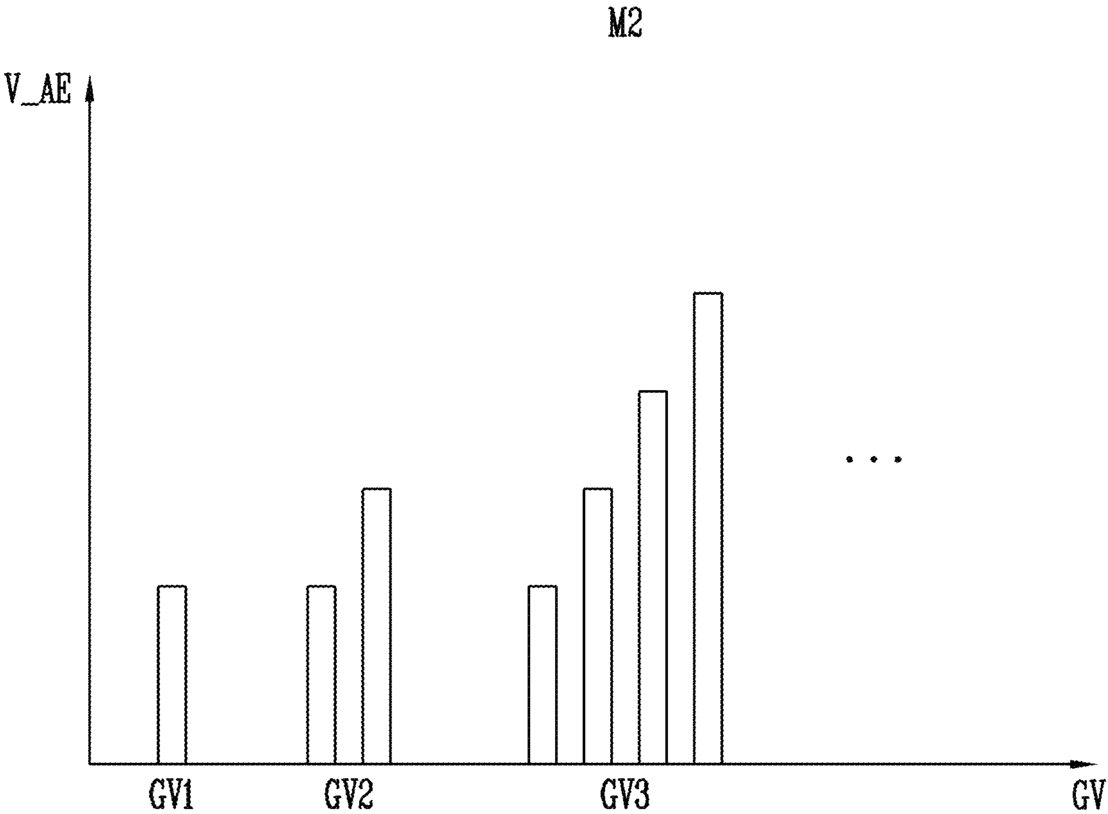
FIG. 13 is a graph illustrating an example in which the display panel of the display device shown in FIG. 1 operates in a second mode.
Figure 14:
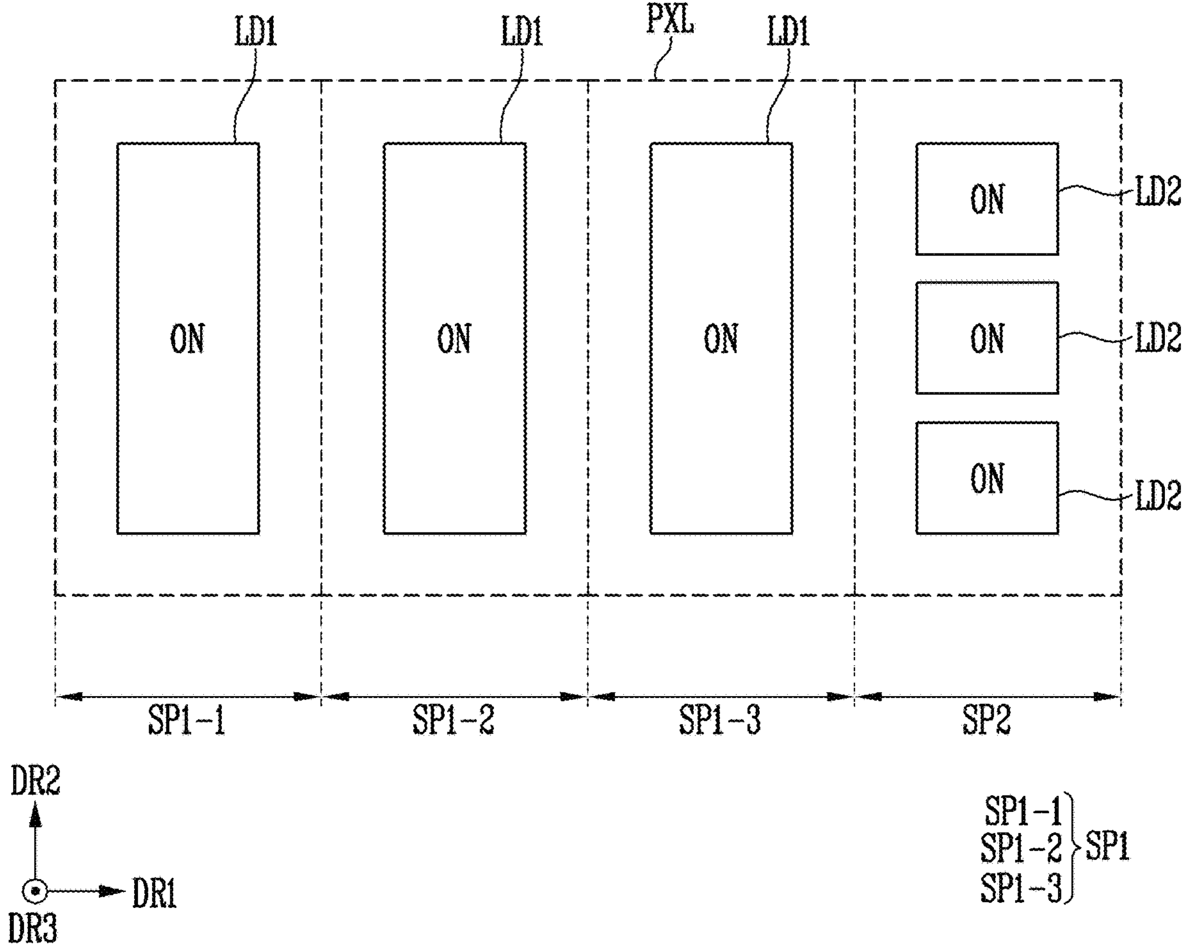
FIG. 14 is a graph illustrating an example in which the sub-pixels of the display device shown in FIG. 1 operate in the second mode.

FIG. 10 is a graph illustrating an example in which the display panel of the display device shown in FIG. 1 operates in a (1-1)th mode. FIG. 11 is a graph illustrating an example in which the display panel of the display device shown in FIG. 1 operates in a (1-2)th mode. FIG. 12 is a graph illustrating an example in which the sub-pixels of the display device shown in FIG. 1 operate in a first mode. FIG. 13 is a graph illustrating an example in which the display panel of the display device shown in FIG. 1 operates in a second mode. FIG. 14 is a graph illustrating an example in which the sub-pixels of the display device shown in FIG. 1 operate in the second mode.

Referring to FIGS. 10 to 14, the display panel may be driven in (1-1)th, (1-2)th, and second modes M1-1, M1-2, and M2, respectively. A peak luminance of the (1-2) th mode M1-2 may be higher than a peak luminance of the (1-1)th mode M1-1. A peak luminance of the second mode M2 may be higher than the peak luminance of the (1-2)th mode M1-2.

The peak luminance represents a maximum luminance which can be displayed, and luminosity of all grayscales may be entirely increased as the peak luminance is increased.

As shown in FIG. 12, the first light emitting elements LD1 may be on in a first mode M1-1 and M1-2, and the second light emitting elements LD2 may be off in the first mode M1-1 and M1-2. As shown in FIG. 14, the first light emitting elements LD1 may be on in the second mode M2, and the second light emitting elements LD2 may be on in the second mode M2. Since the peak luminance of the second mode M2 may be higher than a peak luminance of the first mode M1-1 and M1-2, it may be desirable to display a higher luminance in the second mode M2. The second sub-pixel SP2 may be used in the second mode M2, so that a higher luminance can be implemented.

In an embodiment, a peak luminance may be determined according to a setting of a user. In case that the peak luminance is determined, an operation mode of the display panel may be determined by the controller 150 (see FIG. 1).

In an embodiment, a peak luminance may be determined according to peripheral brightness of the display panel, and an operation mode of the display panel may be determined according to the peak luminance. For example, the display panel may operate in the (1-1)th mode M1-1 in a dark indoor place, operate in the (1-2)th mode M1-2 in a bright indoor place, and operate in the second mode M2 outdoors.

However, the operation mode may not be necessarily determined according to the peak luminance, but may be immediately determined according to the setting of the user or the peripheral brightness.

Referring to FIGS. 2 and 10, an emission time of the first light emitting element LD1 may be controlled in the (1-1)th mode M1-1 according to a grayscale. For example, as the emission time may be lengthened, a displayed luminance may increase. For example, the first light emitting element LD1 may be controlled by the first sub-pixel circuit SPC1 in the (1-1) th mode M1-1. For example, in the (1-1)th mode, the first light emitting element LD1 may emit light by receiving a current generated by the driving transistor of the first sub-pixel circuit SPC1.

In an embodiment, in the (1-1)th mode M1-1, a number of times the first light emitting element LD1 emits light during a frame may increase as the grayscale is increased. For example, at a first grayscale GV1, the first light emitting element LD1 may emit light once in a frame. At a second grayscale GV2 greater than the first grayscale GV1, the first light emitting element LD1 may emit light twice in a frame. At a third grayscale GV3 greater than the second grayscale GV2, the first light emitting element LD1 may emit light four times in a frame.

However, a method of controlling the emission time is not limited to the number of times of light emission is increased. For example, the emission time may be controlled by adjusting a time for which a one-time light emission may be maintained.

In an embodiment, in the (1-1)th mode M1-1, an anode voltage V_AE of the anode electrode AE of the first light emitting element LD1 may be constant regardless of the grayscale. An anode voltage V_AE in the (1-1)th mode M1-1 may be higher than an anode voltage V_AE in the (1-2)th mode M1-2 (see FIG. 13).

Referring to FIGS. 2 to 11, in the (1-2)th mode M1-2, the magnitude of a driving current applied to the first light emitting element LD1 may be controlled according to the grayscale. For example, as the magnitude of the driving current becomes larger, the displayed luminance may increase. For example, the first light emitting element LD1 may be controlled by the second sub-pixel circuit SPC2 in the (1-2)th mode M1-2. For example, in the (1-2)th mode M1-2, the first light emitting element LD1 may emit light by receiving a current generated by the driving transistor of the second sub-pixel SPC2.

For example, an anode voltage V_AE at the first grayscale GV1 may be lower than an anode voltage V_AE at the second grayscale GV2 greater than the first grayscale GV1, and the anode voltage V_AE at the second grayscale GV2 may be lower than an anode voltage V_AE at the third grayscale GV3 greater than the second grayscale GV2.

Referring to FIG. 13, the emission time of the first light emitting element LD1 and the magnitude of the driving current applied to the first light emitting element LD1 may be controlled according to the grayscale in the second mode M2. The emission time of the second light emitting element LD2 and the magnitude of the driving current applied to the second light emitting element LD2 may be controlled according to the grayscale in the second mode M2. In the second mode M2, both the emission time and the magnitude of the driving current may be controlled to implement a luminance higher than the luminance of the first mode M1-1 and M1-2. For example, the first and second light emitting elements LD1 and LD2 may be controlled by the first sub-pixel circuit SPC1 and the second sub-pixel circuit SPC2 in the second mode M2. For example, in the second mode M2, the second sub-pixel circuit SPC2 may receive a current generated by the driving transistor of the first sub-pixel circuit SPC1, and the first and second light emitting elements LD1 and LD2 may emit light by receiving a current generated by the driving transistor of the second sub-pixel circuit SPC2.

In an embodiment, in the second mode M2, a number of times the first and second light emitting elements LD1 and LD2 emit light during a frame may increase as the grayscale is increased. For example, at the first grayscale GV1, the first and second light emitting elements LD1 and LD2 may emit light once in a frame. At the second grayscale GV2 greater than the first grayscale GV1, the first and second light emitting elements LD1 and LD2 may emit light twice in a frame. At the third grayscale GV3 greater than the second grayscale GV2, the first and second light emitting elements LD1 and LD2 may emit light four times in a frame.

In an embodiment, the anode voltage V_AE in the second mode M2 may increase in a frame. For example, in case that the first and second light emitting elements LD1 and LD2 emit light plural times, an anode voltage V_AE in case that the first and second light emitting elements LD1 and LD2 emit light N times may be lower than an anode voltage V_AE in case that the first and second light emitting elements LD1 and LD2 emit light M times. Here, N may be a positive integer, and M may be a positive integer greater than N.

Figure 15:
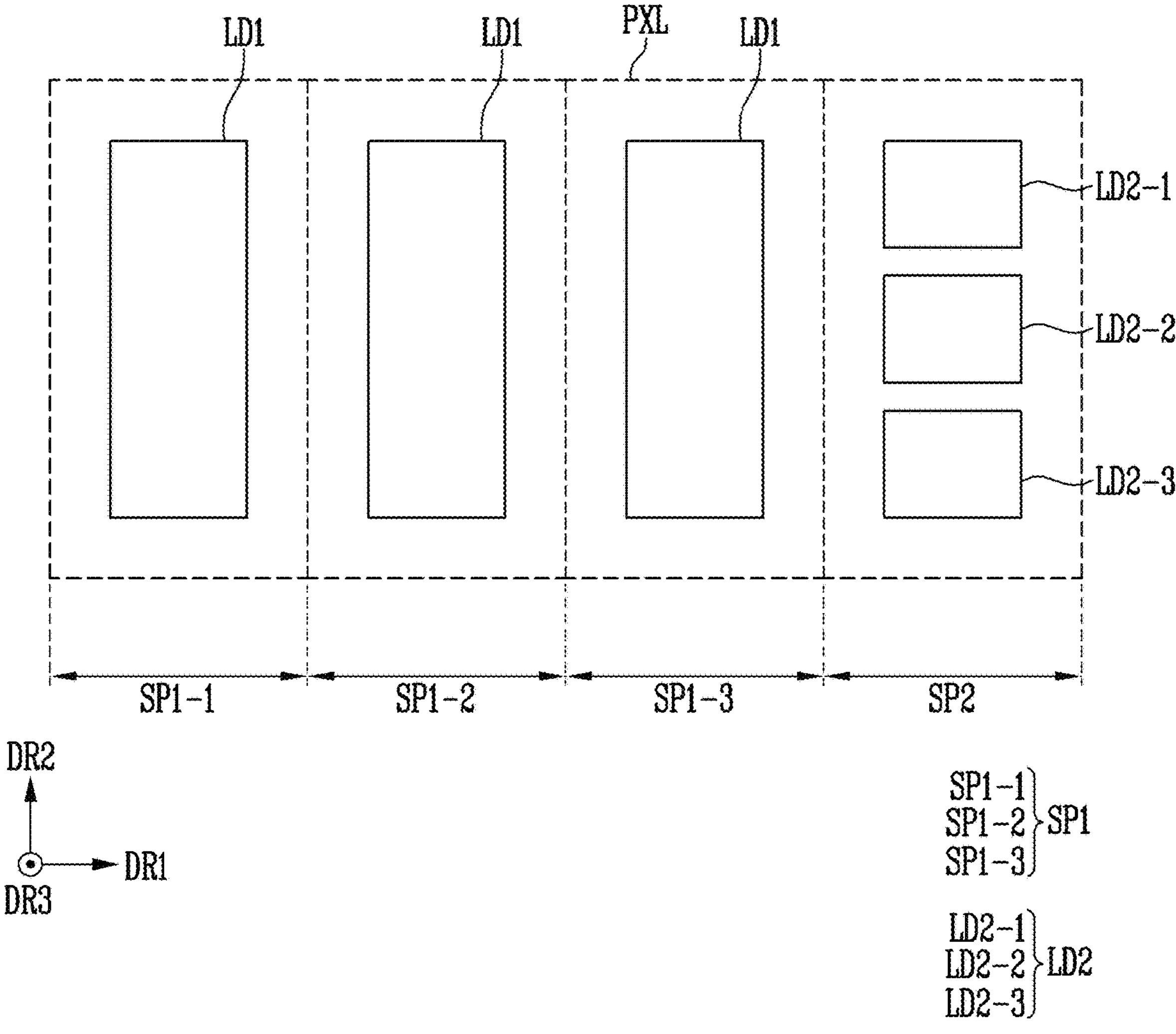
FIG. 15 is a plan view illustrating an embodiment of any one of pixels in accordance with embodiments of the disclosure.

FIG. 15 is a plan view illustrating an embodiment of any one of pixels in accordance with embodiments of the disclosure.

The pixel in accordance with the embodiments of the disclosure may be configured substantially identical to the pixel shown in FIG. 7, except second light emitting elements LD2. Therefore, components identical or similar to those shown in FIG. 7 may be designated by like reference numerals, and overlapping descriptions will be omitted.

Referring to FIG. 15, the second light emitting elements LD2 may display different colors. For example, a (2-1)th light emitting element LD2-1 may display a red color, a (2-2)th light emitting element LD2-2 may display a green color, and a (2-3)th light emitting element LD2-3 may display a blue color. Accordingly, the second sub-pixel SP2 may display a white color.

In an embodiment, the light conversion patterns of the light conversion layer LCL (see FIG. 9) of the second sub-pixel SP2 may include light scattering particles SCT (see FIG. 9). In an embodiment, the light conversion patterns of the light conversion layer LCL (see FIG. 9) of the second sub-pixel SP2 may be omitted.

Figure 16:
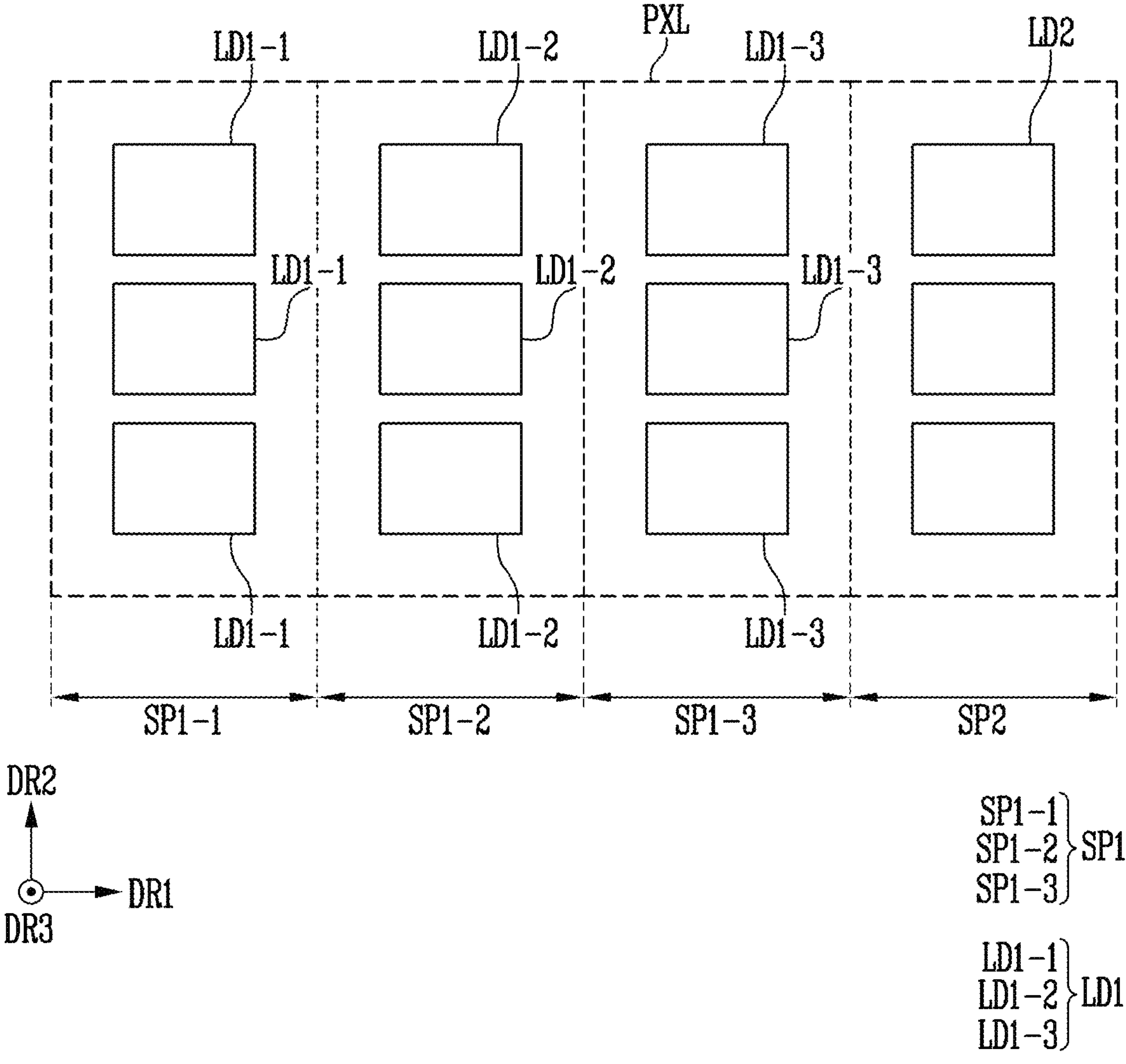
FIG. 16 is a plan view illustrating an embodiment of any one of pixels in accordance with embodiments of the disclosure.

FIG. 16 is a plan view illustrating an embodiment of any one of pixels in accordance with embodiments of the disclosure.

The pixel in accordance with the embodiments of the disclosure may be configured substantially identical to the pixel shown in FIG. 7, except first light emitting elements LD1. Therefore, components identical or similar to those shown in FIG. 7 may be designated by like reference numerals, and overlapping descriptions will be omitted.

Referring to FIG. 16, the (1-1)th sub-pixel SP1-1 may include (1-1)th light emitting elements LD1-1, the (1-2)th sub-pixel SP1-2 may include (1-2)th light emitting elements LD1-2, and the (1-3)th sub-pixel SP1-3 may include (1-3)th light emitting elements LD1-3. For example, the (1-1)th sub-pixel SP1-1 may include (1-1)th light emitting elements LD1-1 electrically connected in parallel, the (1-2)th sub-pixel SP1-2 may include (1-2)th light emitting elements LD1-2 electrically connected in parallel, and the (1-3)th sub-pixel SP1-3 may include (1-3)th light emitting elements LD1-3 electrically connected in parallel.

The second light emitting element LD2 may be larger than each of the (1-1)th to (1-3)th light emitting elements LD1-1 to LD1-3.

The (1-1)th light emitting elements LD1-1 may display a first color, the (1-2)th light emitting elements LD1-2 may display a second color, and the (1-3)th light emitting elements LD1-3 may display a third color. The second light emitting element LD2 may display any one of the first to third colors.

For example, the (1-1)th light emitting elements LD1-1 may display a red color, the (1-2)th light emitting elements LD1-2 may display a green color, the (1-3)th light emitting elements LD1-3 may display a blue color, and the second light emitting element LD2 may display the green color.

In an embodiment, each of the first to third light conversion patterns CCP1 to CCP3 (see FIG. 9) of the (1-1)th to (1-3)th sub-pixels SP1-1 to SP1-3 may include light scattering particles SCT (see FIG. 9). In case that the second light emitting element LD2 displays the second color, the first light conversion pattern CCP1 (see FIG. 9) of the second sub-pixel SP2 may include first color conversion particles QD1 (see FIG. 9), the second light conversion pattern CCP2 (see FIG. 9) of the second sub-pixel SP2 may include light scattering particles SCT (see FIG. 9), and the third light conversion pattern CCP3 (see FIG. 9) of the second sub-pixel SP2 may include third color conversion particles configured to convert light of the second color into light of the third color.

Figure 17:
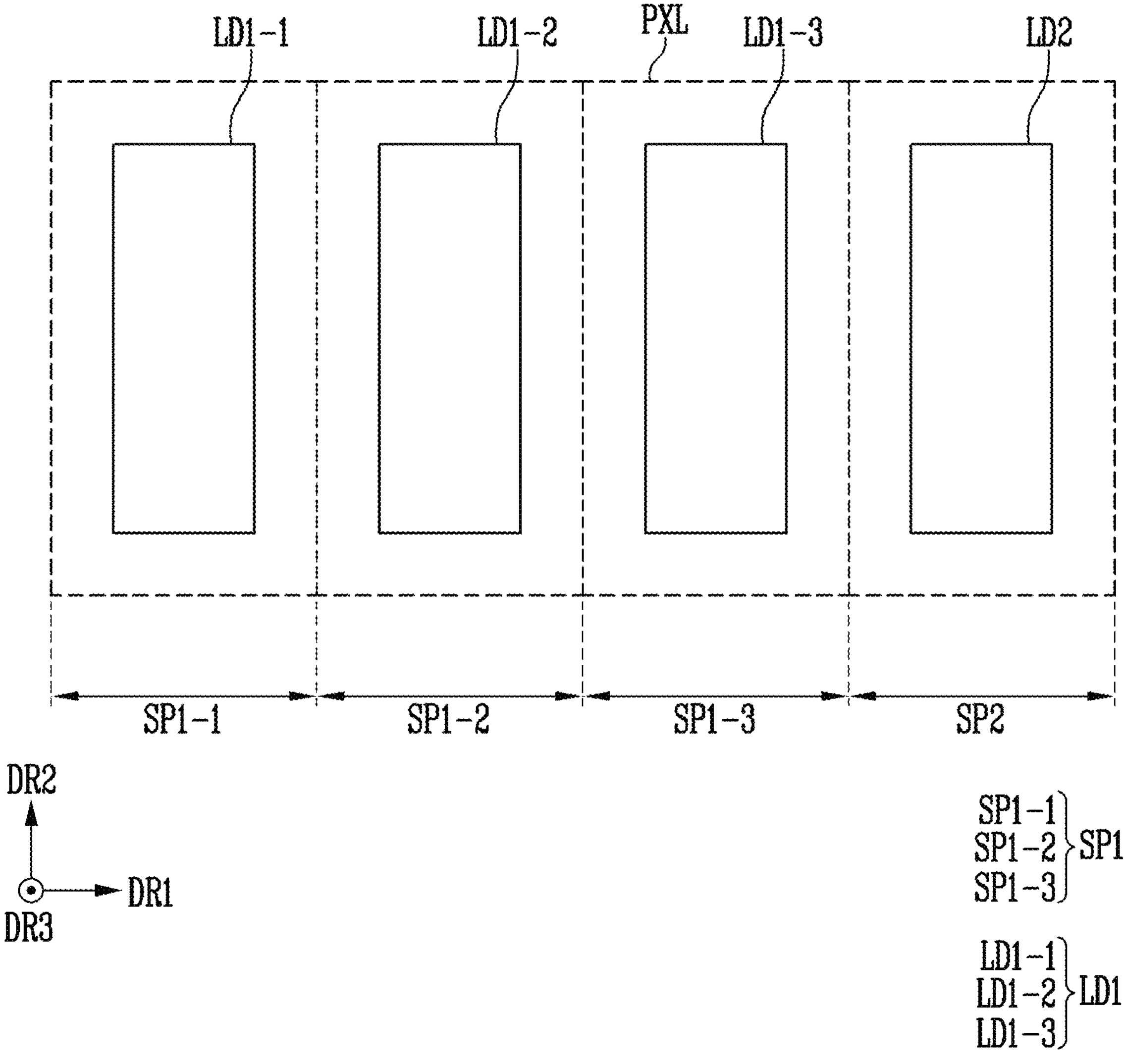
FIG. 17 is a plan view illustrating an embodiment of any one of pixels in accordance with embodiments of the disclosure.

FIG. 17 is a plan view illustrating an embodiment of any one of pixels in accordance with embodiments of the disclosure.

The pixel in accordance with the embodiments of the disclosure may be configured substantially identical to the pixel shown in FIG. 7, except first and second light emitting elements LD1 and LD2. Therefore, components identical or similar to those shown in FIG. 7 may be designated by like reference numerals, and overlapping descriptions will be omitted.

Referring to FIG. 17, the (1-1)the sub-pixel SP1-1 may include a (1-1)th light emitting element LD1-1, the (1-2)th sub-pixel SP1-2 may include a (1-2)th light emitting element LD1-2, and the (1-3)th sub-pixel SP1-3 may include a (1-3)th light emitting element LD1-3.

The first light emitting element LD1 may include an inorganic light emitting diode, and the second light emitting element LD2 may include an organic light emitting element. For example, the (1-1)th light emitting element LD1-1 may include an inorganic light emitting element displaying a red color, the (1-2)th light emitting element LD1-2 may include an inorganic light emitting diode displaying a green color, the (1-3)th light emitting element LD1-3 may include an inorganic light emitting diode displaying a blue color, and the second light emitting element LD2 may include an organic light emitting diode displaying a white color.

In an embodiment, each of the first to third light conversion patterns CCP1 to CCP3 (see FIG. 9) of the (1-1)th to (1-3)th sub-pixels SP1-1 to SP1-3 may include light scattering particles SCT (see FIG. 9).

In an embodiment, each of the first to third light conversion patterns CCP1 to CCP3 (see FIG. 9) of the second sub-pixel SP2 may include light scattering particles SCT (see FIG. 9). In an embodiment, the second sub-pixel SP2 may include a light conversion pattern including the light scattering particles SCT (see FIG. 9).

Figure 18:
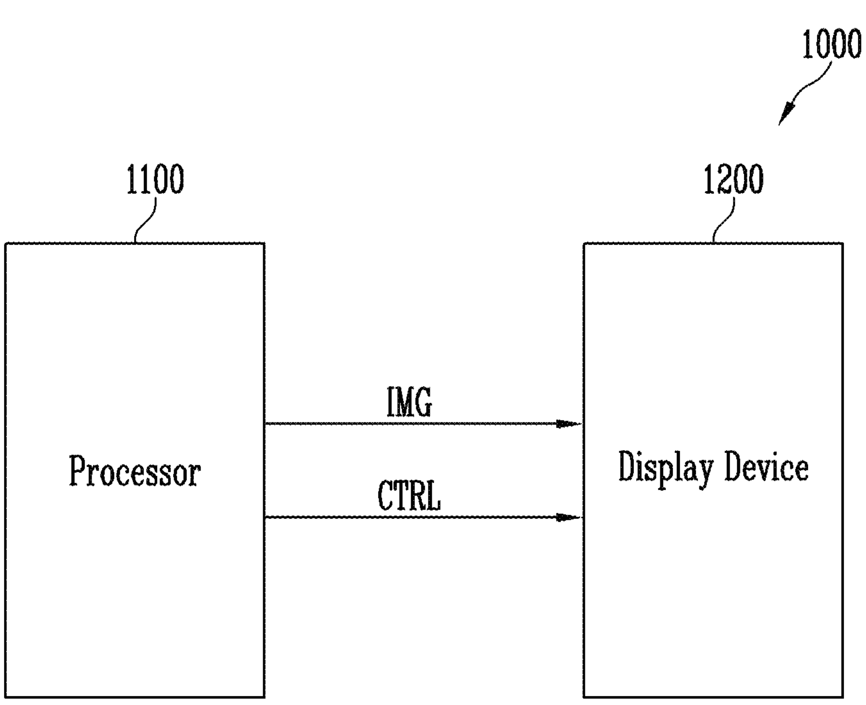
FIG. 18 is a schematic block diagram illustrating an embodiment of a display system.

FIG. 18 is a schematic block diagram illustrating an embodiment of a display system.

Referring to FIG. 18, a display system 1000 may include a processor 1100 and a display device 1200.

The processor 1100 may perform various tasks and various calculations. In embodiments, the processor 1100 may include an Application Processor (AP), a Graphics Processing Unit (GPU), a microprocessor, a Central Processing Unit (CPU), and the like. The processor 1100 may be electrically connected to other components of the display system 1000 through a bus system to control the components of the display system 1000.

The processor 1100 may transmit image data IMG and a control signal CTRL to the display device 1200. The display device 1200 may display an image based on the image data IMG and the control signal CTRL. The display device 1200 may be configured identical to the display device DD described with reference to FIG. 1. The image data IMG and the control signal CTRL may be provided as the input image data IMG and the control signal CTRL, which are shown in FIG. 1, respectively.

The display system 1000 may include a computing system for providing an image display function, such as a smart watch, a mobile phone, a smartphone, a portable computer, a tablet personal computer (PC), a watch phone, an automotive display, a smart glass, a portable multimedia player (PMP), a navigation system, or an ultra mobile computer (UMPC). The display system 1000 may include at least one of a head mounted display (HMD) device, a virtual reality (VR) device, a mixed reality (MR) device, and an augmented reality (AR) device.

FIGS. 19 to 22 are perspective views illustrating application examples of the display system shown in FIG. 18.

Figure 19:
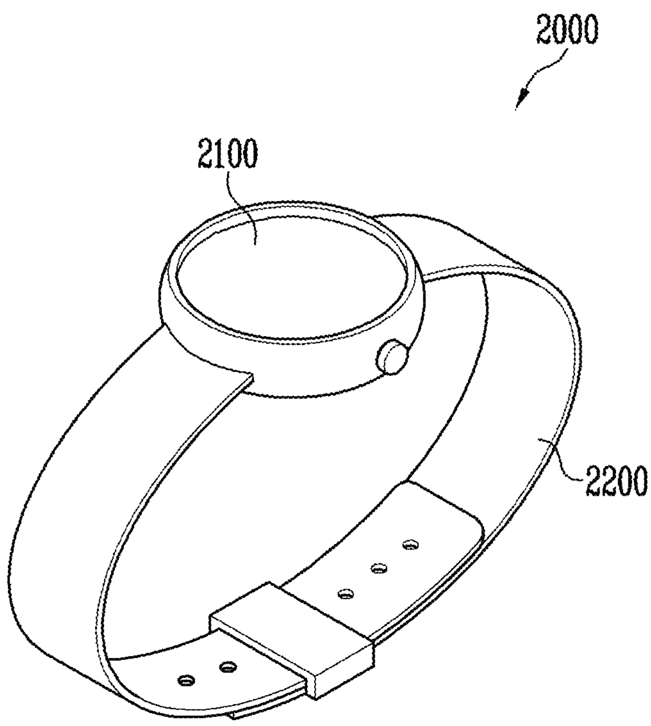
FIGS. 19 to 22 are perspective views illustrating application examples of the display system shown in FIG. 18.

Referring to FIG. 19, the display system 1000 shown in FIG. 18 may be applied to a smart watch 2000 including a display part 2100 and a strap part 2200.

The smart watch 2000 may be a wearable electronic device. For example, the smart watch 2000 may have a structure in which the strap part 2200 may be mounted on a wrist of a user. The display system 1000 and/or the display device 1200 may be applied to the display part 2100, so that image data including time information can be provided to the user.

Figure 20:
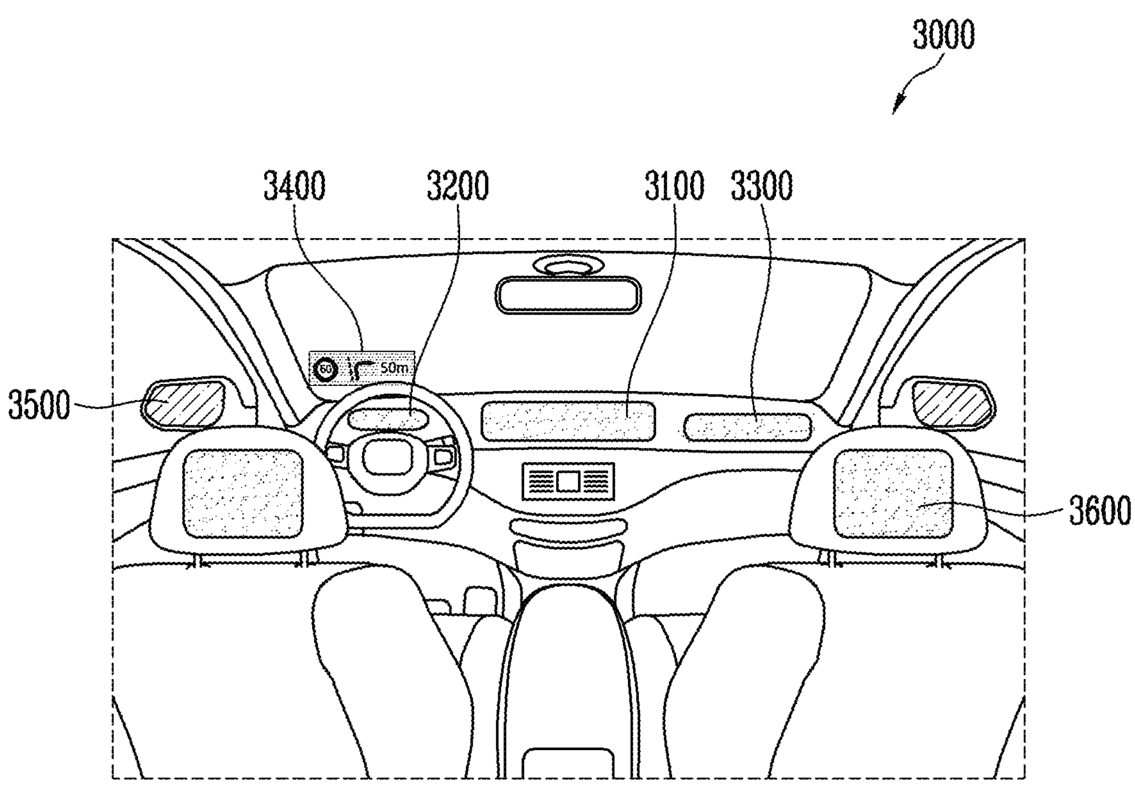

Referring to FIG. 20, the display system 1000 shown in FIG. 18 may be applied to an automotive display system 3000. The automotive display system 3000 may include a computing system provided at the inside/outside of a vehicle to provide image data.

For example, the display system 1000 and/or the display device 1200 may be applied to at least one of an infortainment panel 3100, a cluster 3200, a co-driver display 3300, a head-up display 3400, a side mirror display 3500, and a rear seat display 3600, which may be provided in the vehicle.

Figure 21:
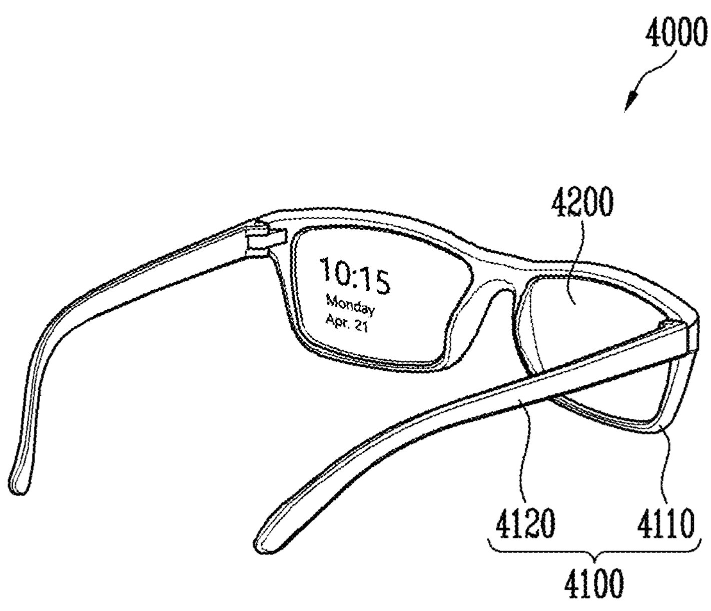

Referring to FIG. 21, the display system 1000 shown in FIG. 18 may be applied to smart glasses 4000. The smart glasses 4000 may be a wearable electronic device which can be worn on the face of a user. For example, the smart glasses 4000 may be a wearable device for Augmented Reality (AR).

The smart glasses 4000 may include a frame 4100 and a lens part 4200. The frame 4100 may include a housing 4110 supporting the lens part 4200 and a leg part 4120 for allowing the user to wear the smart glasses 4000. The leg part 4120 may extend to the housing 4110 through a hinge to be folded or unfolded with respect to the housing 4110.

A battery, a touch pad, a microphone, a camera, and the like may be built in the frame 4100. A projector for outputting light, a processor for controlling a light signal, and the like may be built in the frame 4100.

The lens part 4200 may be an optical member which allows light to be transmitted therethrough or allows light to be reflected thereby. For example, the lens part 4200 may include glass, transparent synthetic resin, and the like.

In order to enable eyes of the user to recognize visual information, the lens part 4200 may allow an image caused by a light signal transmitted from the projector of the frame 4100 to be reflected by a rear surface (e.g., a surface in a direction facing the eyes of the user) of the lens part 4200. For example, the user may recognize information including time, data, and the like, which may be displayed on the lens part 4200. The projector and/or the lens part 4200 may be a kind of display device. The display device 1200 may be applied to the projector and/or the lens part 4200.

Figure 22:
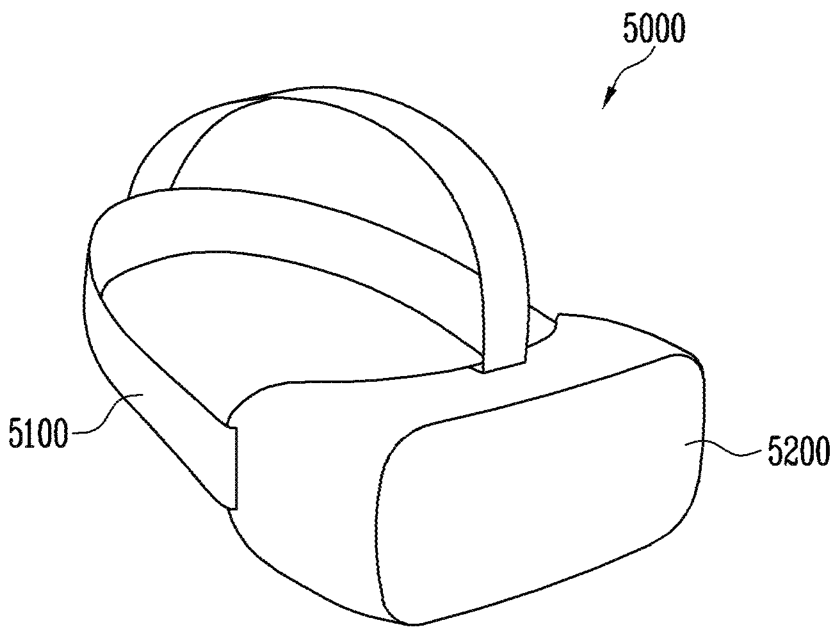

Referring to FIG. 22, the display system 1000 shown in FIG. 18 may be applied to a head mounted display device 5000.

The head mounted display device 5000 may be a wearable electronic device which can be worn on the head of a user. For example, the head mounted display device 5000 may be a wearable device for virtual reality (VR) or mixed reality (MR).

The head mounted display device 5000 may include a head mounted band 5100 and a display accommodating case 5200. The head mounted band 5100 may be electrically connected to the display accommodating case 5200. The head mounted band 5100 may include a horizontal band and/or a vertical band used to fix the head mounted display device 5000 to the head of the user. The horizontal band may be configured to surround a side portion of the head of the user, and the vertical band may be configured to surround an upper portion of the head of the user. However, embodiments are not limited thereto. For example, the head mounted band 5100 may be implemented in the form of a glasses frame, a helmet or the like.

The display accommodating case 5200 may accommodate the display system 1000 and/or the display device 1200.

The disclosure can be applied to display devices and electronic devices including the same. For example, the disclosure can be applied to digital TVs, 3D TVs, mobile phones, smart phones, tablet computers, VR devices, PCs, home appliances, notebook computers, PDAs, PMPs, digital cameras, music players, portable game consoles, navigation systems, and the like.

In accordance with the disclosure, the display device includes second sub-pixels in addition to existing first sub-pixels, so that an image with a higher luminance can be displayed.

Example embodiments have been disclosed herein, and although specific terms may be employed, they may be used and may be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims.

What is claimed is:

1. A display device comprising:

a display panel including a pixel;

a data driver configured to provide a data voltage to the pixel;

a gate driver configured to provide a gate signal to the pixel; and a controller configured to control the data driver and the gate driver, wherein the pixel includes:

a first sub-pixel including a first light emitting element; and a second sub-pixel including:

a plurality of second light emitting elements emitting blue light, and a plurality of light conversion patterns having different light conversion functions and converting the emitted blue light into white light, and wherein the display panel is driven in one of a plurality of driving modes that independently modulate emission time and driving current for the first sub-pixel and the second sub-pixel as a function of grayscale.

2. The display device of claim 1, wherein each of the plurality of second light emitting elements is smaller than the first light emitting element.

3. The display device of claim 1, wherein the plurality of second light emitting elements are electrically connected in parallel.

4. The display device of claim 1, wherein each of the plurality of second light emitting elements displays a same color as the first light emitting element.

5. The display device of claim 1, wherein the first light emitting element is on in a first mode, and the plurality of second light emitting elements are off in the first mode.

6. The display device of claim 5, wherein the first light emitting element is on in a second mode, and the plurality of second light emitting elements are on in the second mode.

7. The display device of claim 6, wherein a peak luminance in the second mode is higher than a peak luminance in the first mode.

8. The display device of claim 1, wherein the display panel is driven in one of a (1-1)th mode, a (1-2)th mode, and a second mode, an emission time of the first light emitting element is controlled according to a grayscale in the (1-1)th mode, a magnitude of a driving current applied to the first light emitting element is controlled according to the grayscale in the (1-2)th mode, the emission time of the first light emitting element and the magnitude of the driving current applied to the first light emitting element are controlled according to the grayscale in the second mode, and an emission time of the plurality of second light emitting elements and a magnitude of a driving current applied to the plurality of second light emitting elements are controlled according to the grayscale in the second mode.

9. The display device of claim 8, wherein the display panel includes sub-pixels including the first sub-pixel and the second sub-pixel, and each of the sub-pixels includes:

a first sub-pixel circuit configured to control an emission time of a light emitting element of each of the sub-pixels according to the grayscale; and a second sub-pixel circuit configured to control a magnitude of a driving current applied to the light emitting element according to the grayscale.

10. The display device of claim 9, wherein the first light emitting element is controlled by the first sub-pixel circuit in the (1-1)th mode, is controlled by the second sub-pixel circuit in the (1-2)th mode, and is controlled by the first sub-pixel circuit and the second sub-pixel circuit in the second mode, and the plurality of second light emitting elements are controlled by the first sub-pixel circuit and the second sub-pixel circuit in the second mode.

11. The display device of claim 1, wherein the first sub-pixel includes:

a (1-1)th sub-pixel displaying a first color;

a (1-2)th sub-pixel displaying a second color; and a (1-3)th sub-pixel displaying a third color, the (1-1)th sub-pixel includes a first light conversion pattern, the (1-2)th sub-pixel includes a second light conversion pattern, the (1-3)th sub-pixel includes a third light conversion pattern, and the second sub-pixel includes the first to third light conversion patterns.

12. The display device of claim 11, wherein the first to third light conversion patterns in the second sub-pixel overlap each other.

13. The display device of claim 1, wherein the first sub-pixel includes:

a (1-1)th sub-pixel displaying a first color;

a (1-2)th sub-pixel displaying a second color; and a (1-3)th sub-pixel displaying a third color, the (1-1)th sub-pixel includes a first color filter, the (1-2)th sub-pixel includes a second color filter, the (1-3)th sub-pixel includes a third color filter, and the second sub-pixel does not include the first to third color filters.

14. A display device comprising:

a display panel including a pixel;

a data driver configured to provide a data voltage to the pixel;

a gate driver configured to provide a gate signal to the pixel; and a controller configured to control the data driver and the gate driver, wherein the pixel includes:

a (1-1)th sub-pixel including a plurality of (1-1)th light emitting elements;

a (1-2)th sub-pixel including a plurality of (1-2)th light emitting elements;

a (1-3)th sub-pixel including a plurality of (1-3)th light emitting elements, wherein each of the (1-1)th light emitting elements, (1-2)th light emitting elements, and (1-3)th light emitting elements not overlapping each other in a thickness direction; and a second sub-pixel including a second light emitting element, wherein the display panel is driven in one of a plurality of driving modes that independently modulate emission time and driving current for the (1-1)th sub-pixel, the (1-2)th sub-pixel, and the (1-3)th sub-pixel as a function of grayscale.

15. The display device of claim 14, wherein the plurality of (1-1)th light emitting elements display a first color, the plurality of (1-2)th light emitting elements display a second color, the plurality of (1-3)th light emitting elements display a third color, and the second light emitting element displays any one of the first to third colors.

16. A display device comprising:

a display panel including a pixel;

a data driver configured to provide a data voltage to the pixel;

a gate driver configured to provide a gate signal to the pixel; and a controller configured to control the data driver and the gate driver, wherein the pixel includes:

a first sub-pixel including a first light emitting element including an inorganic light emitting diode displaying one of a red color or a green color; and a second sub-pixel including a second light emitting element including an organic light emitting diode displaying a white color, wherein the display panel is driven in one of a plurality of driving modes that independently modulate emission time and driving current for the first sub-pixel and the second sub-pixel as a function of grayscale.

* * * * *